US008539420B2

(12) United States Patent
Camarota

(10) Patent No.: US 8,539,420 B2
(45) Date of Patent: Sep. 17, 2013

(54) METHOD AND APPARATUS FOR SELF-ANNEALING MULTI-DIE INTERCONNECT REDUNDANCY CONTROL

(75) Inventor: Rafael C. Camarota, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 97 days.

(21) Appl. No.: 13/176,586

(22) Filed: Jul. 5, 2011

(65) Prior Publication Data
US 2013/0009694 A1 Jan. 10, 2013

(51) Int. Cl.
*G06F 17/50* (2006.01)
*G06F 11/16* (2006.01)

(52) U.S. Cl.
USPC ............................ 716/126; 716/137; 327/526

(58) Field of Classification Search
USPC .................. 716/126, 129, 130, 137; 327/526
See application file for complete search history.

(56) References Cited

U.S. PATENT DOCUMENTS
7,701,252 B1 4/2010 Chow et al.
2010/0295600 A1* 11/2010 Kim et al. .................. 327/365

FOREIGN PATENT DOCUMENTS
EP 0 351 983 A2 1/1990

* cited by examiner

*Primary Examiner* — Vuthe Siek
(74) *Attorney, Agent, or Firm* — Gerald Chan

(57) ABSTRACT

An apparatus for interconnecting a first die and a second die of a multi-die device includes a master circuit block that interfaces with the first die of the multi-die device, a slave circuit block that interfaces with the second die of the multi-die device, a first memory in the slave circuit block, a second memory in the master circuit block, and a plurality of μbumps between the first die and the second die, wherein the master circuit block and the slave circuit block are configured to identify one of the μbumps as a faulty μbump, and store a first value that corresponds with the identified faulty μbump in the first memory.

18 Claims, 28 Drawing Sheets

TABLE 1

| Output State | Good | Start M/S=1 | Start M/S=0 | MR | MG | MOE | MPU Active Low | MPD |
|---|---|---|---|---|---|---|---|---|
| POR | 0 | 0 | 0 | 1 | 0 | 0 | 0 | 0 |
| PWR Good | Z | 0 | 0 | 1 | 0 | 0 | 0 | 0 |
| Master (M) | Z | 0 | N/A | 0 | 0 | 0 | 0 | 0 |
| Slave (SL) | Z | N/A | Z | 0 | 0 | 0 | 0 | 0 |
| Reset (R) | Z | 0 | Z | 1 | 0 | 0 | 0 | 0 |
| Send (S) | Z | 0 | Z | 0 | 0 | 0 | 1 | 1 |
| Receive (Rec) | Z | 0 | Z | 0 | 0 | 0 | 0 | 0 |
| Write (Wrt) | Z | 0 | Z | 0 | ⊓ | 1 | 0 | 0 |
| Idle (I) | Z | 0 | Z | 0 | 0 | 0 | 1 | 0 |
| Wait (W) | Z | 1 | Z | 0 | 0 | 0 | Last | Last |

FIG. 5B

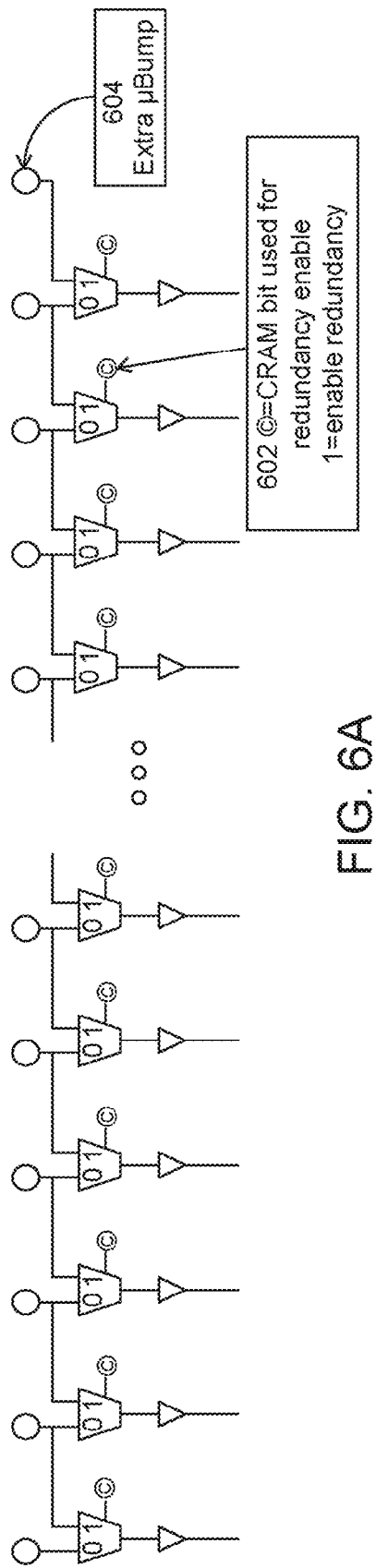
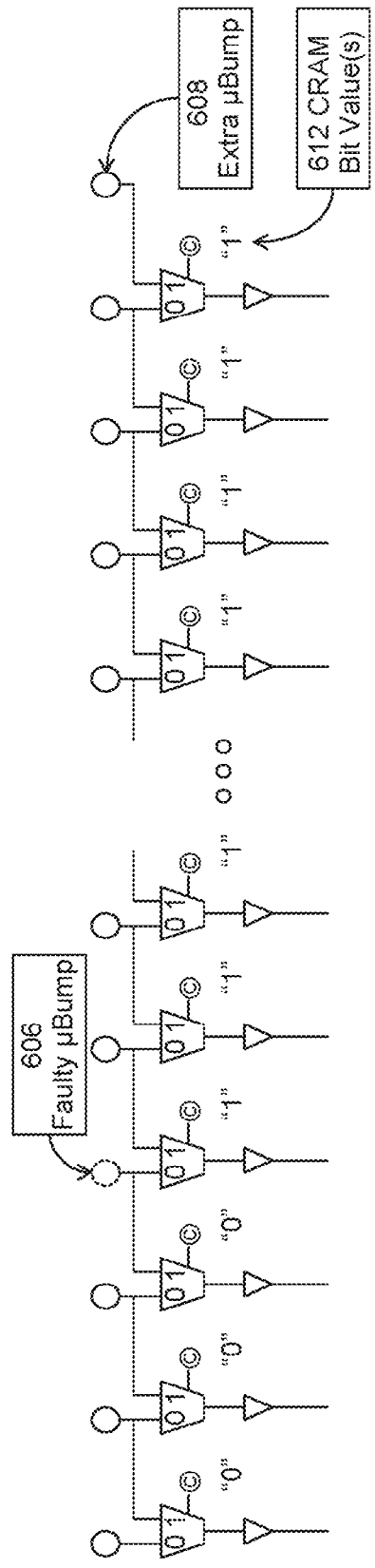
FIG. 6A
FIG. 6B

US 8,539,420 B2

METHOD AND APPARATUS FOR SELF-ANNEALING MULTI-DIE INTERCONNECT REDUNDANCY CONTROL

TECHNICAL FIELD

Embodiments described herein relate to multi-die interconnect architectures, and in particular, to a method of and apparatus for addressing faulty connections in multi-die interconnect architectures.

BACKGROUND

Micro bump structure (μbump) is one of the key technologies in multiple die module (MDM), system in package (SIP), or multi-chip-module (MCM) (hereinafter multi-die interconnect architecture.) A common multi-die interconnect often includes hundreds of thousands or millions of μbumps between two semiconductor dies, whereas ensuring 100% yield of all the μbumps is unrealistic. Thus, it is not uncommon to have one or more faulty μbump(s) in a device.

Examples of a faulty μbump includes but are not limited to: missing μbump, deformation of a μbump, an under-sized μbump, a partially formed μbump, or damaged μbump (e.g., cracked or broken μbump), wherein each of these may result in an open connection. A μbump may also be considered faulty if it is connected to a broken trace, or to a faulty circuit, which prevents the μbump from transmitting and/or receiving signals. Also, μbumps may fail due to wear and tear over time or due to environmental effects such as those arising from temperature fluctuations. Some faulty μbumps may be marginally functional. For example, these μbumps may function as intended at certain temperature range and may malfunction at some other temperature range. Sometimes, an interposer that includes a plurality of μbumps may be used to connect two dies. Such interposer may also have faulty μbump(s).

As used in this specification, the term "faulty μbump" may refer to any μbump that fails to perform according to a predefined criteria, any μbump that is unacceptable, or any μbump (which may be perfect itself) that does not transmit and/or receive signals due to a faulty trace or circuit connecting to the μbump. Thus, a faulty μbump may be due to any failure mode, including but not limited to the examples mentioned previously.

Redundancy is a method for compensating for a failing or failed resource by having extra unit(s) of a resource to replace the failed or failing resource with one or more of the extra unit(s) of the resource to restore the intended functionality of the failed or failing resource.

The conventional redundancy techniques give rise to various disadvantages and difficulties. Therefore, it is desirable to have a more flexible and robust method and apparatus for providing redundancy in multi-die interconnect.

SUMMARY

In accordance with some embodiments, an apparatus for interconnecting a first die and a second die of a multi-die device includes a master circuit block that interfaces with the first die of the multi-die device, a slave circuit block that interfaces with the second die of the multi-die device, a first memory in the slave circuit block, a second memory in the master circuit block, and a plurality of μbumps between the first die and the second die. The master circuit block and the slave circuit block are configured to identify one of the μbumps as a faulty μbump, and store a first value that corresponds with the identified faulty μbump in the first memory.

The master circuit block can be integrated with the first die; and the slave circuit block can be integrated with the second die. The first and second memories can be volatile or non-volatile memories. The apparatus can include a carrier die that includes μbumps and redundant μbumps interfacing with the first die and the second die, the first die and the second die being connected indirectly through the carrier die.

In any of the embodiments described herein, the master circuit block and the slave circuit block can be configured to replace a functionality of the faulty μbump with a functionality of another one of the plurality of μbumps.

In any of the embodiments described herein, the master circuit block and the slave circuit block can be configured to replace the functionality of the faulty μbump with the functionality of another one of the plurality of μbumps based at least in part on the value stored in the first volatile memory.

In any of the embodiments described herein, the master circuit block and the slave circuit block can be configured to store a second value in the second volatile memory, and to determine a third value based on the first and the second values that are stored in the first and second volatile memories, respectively.

In any of the embodiments described herein, at least one of the μbumps can be a faulty μbump.

In accordance with other embodiments, an apparatus for interconnecting a first die and a second die of a multi-die device includes a master self-annealing circuit block that interfaces with the first die of the multi-die device and comprises a master controller, a slave self-annealing circuit block that interfaces with the second die of the multi-die device and comprises a slave controller, a first volatile memory in the slave self-annealing circuit block, a second volatile memory in the master self-annealing circuit block, a μbump and a redundant μbump. The master self-annealing circuit block and the slave self-annealing circuit block are configured to interconnect the first die and the second die using one of the μbump and the redundant μbump.

In any of the embodiments described herein, the μbump can be a faulty μbump, and the master controller and the slave controller can be configured for determining whether there is another μbump situated between the redundant μbump and the faulty μbump, and replacing a functionality of the faulty μbump based at least in part upon a result of the act of determining.

In any of the embodiments described herein, the master controller and the slave controller can be configured for replacing the functionality of the faulty μbump with a functionality of the redundant μbump when there is no μbump or at least one μbump between the faulty μbump and the redundant μbump.

In any of the embodiments described herein, the master controller and the slave controller can be configured for determining a first redundancy value and storing the first redundancy value in the first volatile memory in the slave self-annealing circuit block, determining a second redundancy value and storing the second redundancy value in the second volatile memory in the master self-annealing circuit block, determining one or more values from at least the first redundancy value and the second redundancy value, and selectively using one of the μbump and the redundant μbump to interconnect the first die and the second die based at least in part upon the one or more values that are determined from at least the first redundancy value and the second redundancy value.

In any of the embodiments described herein, the slave controller can be configured to determine a first redundancy value for storing in the first volatile memory by enabling a master pull-down transistor in the master self-annealing circuit block, and enabling a slave pull-up transistor in the slave self-annealing circuit block.

In any of the embodiments described herein, the slave controller can operate at a slave clock frequency, the master controller can operate at a master clock frequency, and the master clock frequency can be different from the slave clock frequency.

In any of the embodiments described herein, the master controller and the slave controller can be further configured to reset the first volatile memory and the second volatile memory, and to disable one or more output buffers of the multi-die device.

In other embodiments, a method for interconnecting a first die and a second die of a multi-die device includes determining a master-slave relationship between a master controller of a master self-annealing circuit block for the first die of the multi-die device and a slave controller of a slave self-annealing circuit block for the second die of the multi-die device. The first die and the second die are coupled together through the master self-annealing circuit block, the slave self-annealing circuit block, and one of a first μbump or a second μbump. The method further includes storing a first redundancy value in a first volatile memory that is operatively connected to the slave controller, and storing a second redundancy value in a second volatile memory that is operatively connected to the master controller.

In any of the embodiments described herein, the method can further include replacing a functionality of the first μbump with a functionality of the second μbump based at least in part upon one or more values, wherein the one or more values are derived from at least the first redundancy value stored in the first volatile memory and the second redundancy value stored in the second volatile memory.

In any of the embodiments described herein, the method can further include determining a first power using the master controller, transmitting a first power good signal using the master controller based at least in part upon a first criterion, determining a second power using the slave controller, transmitting a second power good signal using the slave controller based at least in part upon a second criterion, and determining whether to replace a functionality of the first μbump with a functionality of the second μbump based at least in part upon the first power good signal and the second power good signal.

In any of the embodiments described herein, the method can further include resetting the first volatile memory, resetting the second volatile memory, disabling a master output buffer in the master self-annealing circuit block, and disabling a slave output buffer in the slave self-annealing circuit block.

In any of the embodiments described herein, the method can further include determining the first redundancy value by enabling a first plurality of pull-down transistors in the master self-annealing circuit block using the master controller, and enabling a second plurality of pull-up transistors in the slave self-annealing circuit block using the slave controller.

In accordance with other embodiments, an apparatus for interconnecting a first die and a second die of a multi-die device includes a first controller that interfaces with the first die of the multi-die device, a second controller that interfaces with the second die of the multi-die device and is interconnected with the first controller through a first μbump and a second μbump, and a plurality of circuit slices. Each of the plurality of circuit slices interfaces with both the first die and the second die of the multi-die device, and is controlled by both the first controller and the second controller. The first controller and the second controller are in a master-and-slave relationship in which one of the first controller and the second controller is a master, and another one of the first controller and the second controller is a slave. The master is configured to initiate a self-annealing process based at least in part upon a master internal oscillator, and the slave is configured to make state transitions based on a rate determined by a slave internal oscillator and the master.

In any of the embodiments described herein, the first controller and the second controller can be not synchronized, and the first controller and the second controller can be architecturally identical but configured to behave differently based at least in part upon the master-slave relationship.

In any of the embodiments described herein, the first controller can comprise a first master-slave select pin, and can be configured to sample first inputs at the first master-slave select pin based at least in part upon a first power associated with the first die. The second controller can comprise a second master-slave select pin, and can be configured to sample second inputs at the second master-slave select pin based at least in part upon a second power associated with the second die. The master-slave relationship can be based at least in part upon the first inputs and the second inputs that are sampled, where the master is configured to drive a first signal to initiate the self-annealing process, and the slave is configured to use the first signal from the master as an input signal.

Other and further aspects and features will be evident from reading the following detailed description of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered, which are illustrated in the accompanying drawings. These drawings depict only typical embodiments and are not therefore to be considered limiting of its scope.

FIG. 5B illustrates a self-annealing μbump redundancy repair control state machine output function table in accordance with some embodiments.

FIGS. 6A-B illustrate an exemplary repair implementation of a μbump in accordance with some embodiments.

DETAILED DESCRIPTION

Figure 1:
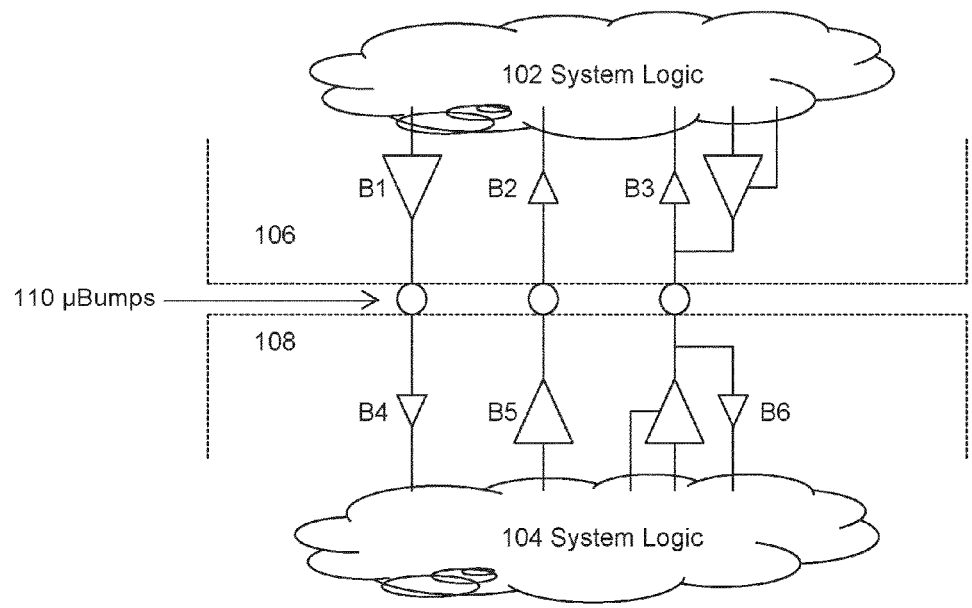
FIG. 1 illustrates a multi-die interconnect architecture where a first die interacting with the system logic is interconnected to a second die via three μbumps.

Various embodiments are described hereinafter with reference to the figures. It should be noted that the figures are not drawn to scale and that elements of similar structures or functions are represented by like reference numerals throughout the figures. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated. Also, reference throughout this specification to "some embodiments" or "other embodiments" means that a particular feature, structure, material, or characteristic described in connection with the embodiments is included in at least one embodiment. Thus, the appearances of the phrase "in some embodiments" or "in other embodiments" in various places throughout this specification are not necessarily referring to the same embodiment or embodiments.

Figure 2:
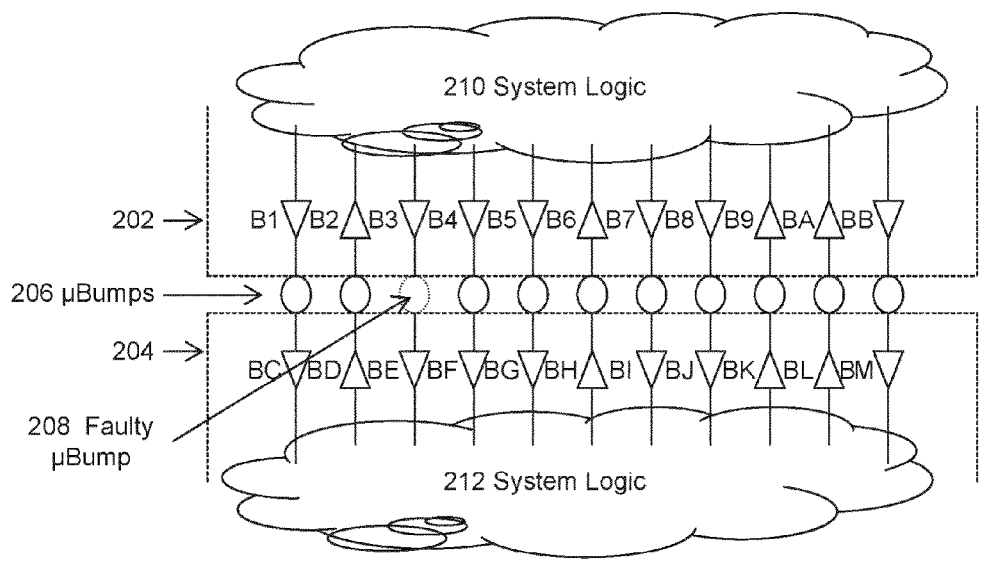
FIG. 2 illustrates a typical failure of the interconnect architecture due to a faulty μbump.

FIG. 1 illustrates a multi-die interconnect architecture where a first die 106 interacting with the system logic 102 is interconnected to a second die 108 via three μbumps 110. The second die 108 interacts with the system logic 104. FIG. 2 illustrates an exemplary multi-die interconnect architecture between the first die 202 and the second die 204 via a series of μbumps 206. The first die 202 interacts with system logic 210, and the second die interacts with system logic 212. FIG. 2 further illustrates a typical failure of the interconnect architecture by having a missing μbump at 208 that is supposed to interconnect the buffers B3 and BE.

Figure 3:
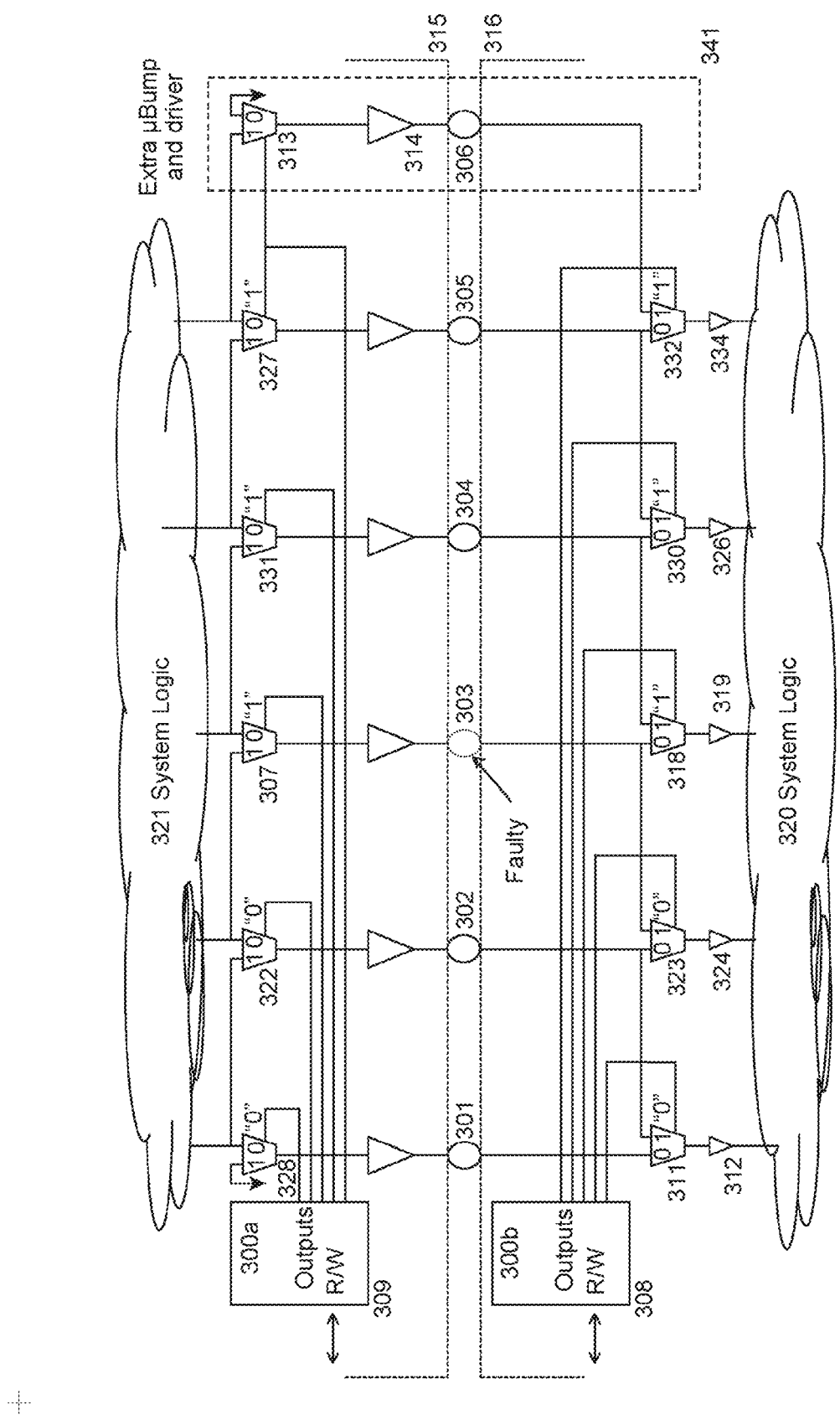
FIG. 3 illustrates a cascading redundancy technique using non-volatile memory to control the multiplexing of the redundant resources by programming the redundancy into the non-volatile memory.

FIG. 3 illustrates a cascading redundancy technique using non-volatile memory to control the multiplexing of the redundant resources by programming the redundancy into the non-volatile memory. The architecture as illustrated in the figure includes the first die 315 that is interconnected to the second die 316 via a series of μbumps 301, 302, 303, 304, 305, 306 where μbump 306 represents the redundant μbump. Thus, as used in this specification, the term "μbump" may refer to any μbump, which may be a functional μbump (redundant or not), or a faulty μbump. In the illustrated architecture, the first die 315 interacts with system logic 321 via a series of multiplexers 328, 322, 307, 331, 327, and the second die 316 interacts with system logic 320 via a series of multiplexers 311, 323, 318, 330, 332 whose outputs drives the respective output buffers 312, 324, 319, 326, 334. The architecture of FIG. 3 further includes an extra μbump 306 with extra driver (the multiplexer 313 and the output buffer 314). The first die 315 further includes a controller block 309 that includes some non-volatile memory 300a to control the multiplexing of the redundant resources. Similarly, the second die 316 also includes a controller block 308 that includes some non-volatile memory 300b to control the multiplexing of the redundant resources. As it can be seen from the figure, the architecture is missing μbump 303 in the interconnection. The architecture uses the non-volatile memories 300a, 300b to control multiplexing by providing the select signals to the multiplexers.

In this example, control blocks 309 and 308 drive a "0" as a "select" signal to the multiplexers where the corresponding μbump is present and a "1" where the corresponding μbump is missing. For example, the select signals for multiplexers 328, 322, 311, and 323 are "0", and that for multiplexers 307, 331, 327, 313, 318, 330, and 332 are "1" to indicate that μbump 304 is used to replace the functionality of the missing μbump 303, μbump 305 is used to replace the functionality of the μbump 304, and the extra μbump 306 is used to replace the functionality of μbump 305.

Figure 4:
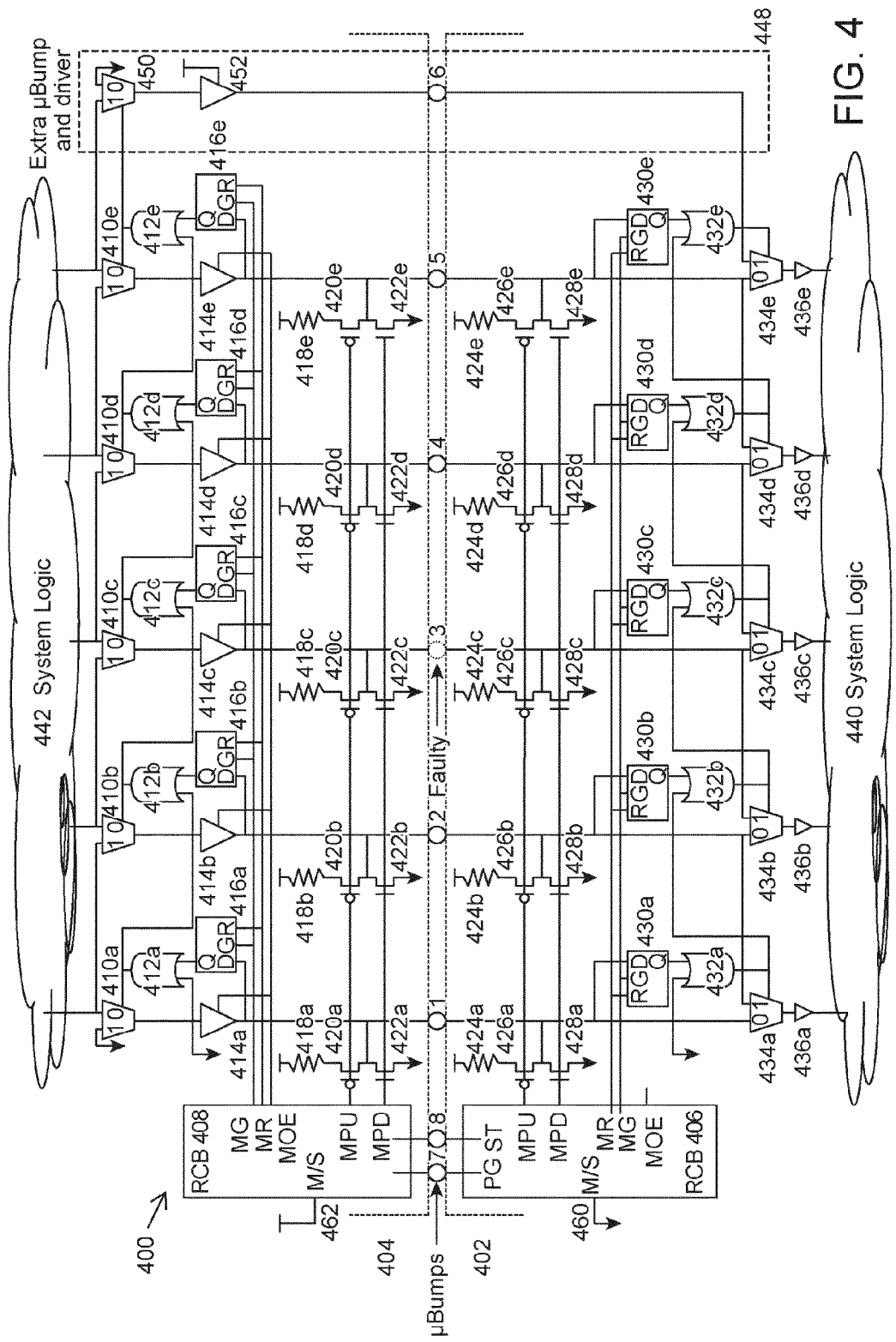
FIG. 4 illustrates an apparatus for self-annealing multi-die interconnect redundancy control in accordance with some embodiments, wherein the apparatus has two repair control blocks (RCB).

Referring to FIG. 4, which illustrates another apparatus 400 for self-annealing multi-die interconnect redundancy control in accordance with some embodiments, the apparatus 400 comprises two repair control blocks (RCB) 406 and 408. The RCB 406 of the apparatus 400 is integrated with a first die 402 that includes a system logic portion 440, and the RCB 408 of the apparatus 400 is integrated with a second die 404 that includes a system logic portion 442. The RCB 406 is used to control the components (first self-annealing circuit block) that are coupled to the system logic portion 440 in the first die 402, and the RCB 408 is used to control the components (second self-annealing circuit block) that are coupled to the system logic 442 in the second die 404. The first die 402 and the second die 404 are interconnected with a plurality of μbumps 1, 2, 3, 4, 5, and with a redundant μbump 6. The redundant µbump 6 is driven by a three-state buffer 452 that is operatively connected to a multiplexer (MUX) 450 for redundancy control.

Figure 12:
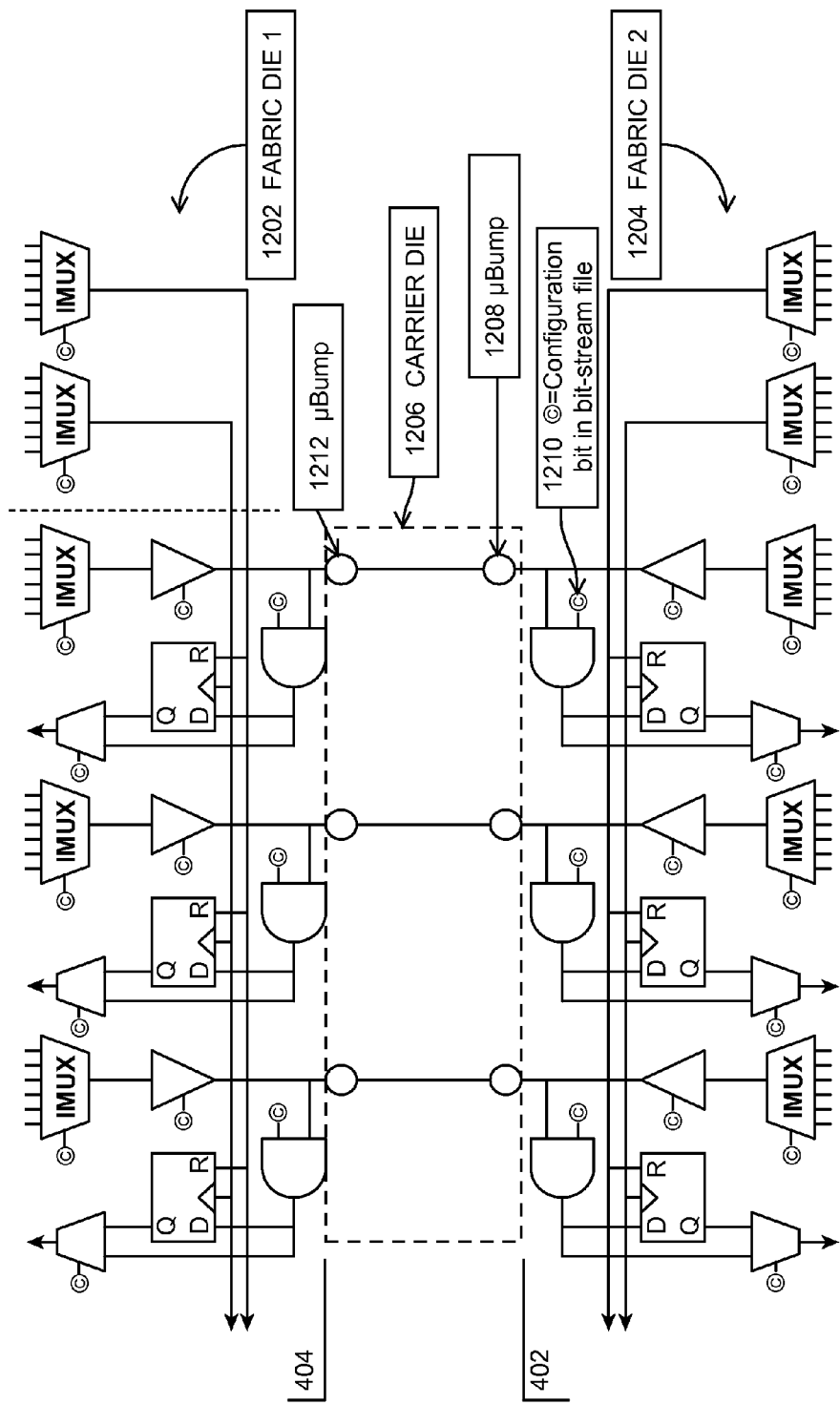
FIG. 12 illustrates an exemplary implementation for a multi-die device with bi-directional signals in accordance with some embodiments.

Although the apparatus 400 is illustrated as having µbumps 1, 2, 3, 4, 5, and the redundant µbump 6 directly connecting the first die 402 and the second die 404, in alternative embodiments, the first die 402 and the second die 404 may be connected indirectly through a passive interposer that includes µbumps and redundant µbump(s). An example of such implementation is illustrated in FIG. 12, which will be discussed in further detail below. Also, in further embodiments, instead of having one redundant µbump 6 in each row, the apparatus 400 may have a plurality of µbump 6 in each row.

Returning to FIG. 4, the RCB 406 and RCB 408 are interconnected via two µbumps 7 and 8. In some embodiments, the RCB 406 and RCB 408 constitute a state machine that establishes a two-µbump handshake. The first die 402 and the second die 404 are architectural identical as long as one of the two RCBs 406, 408 is designated or determined as the master, and the other one of the two RCBs 406, 408 is designated or determined as the slave. It should be noted that although two RCBs 406, 408 are shown, in other embodiments, the apparatus 400 may have more than two RCBs. For example, in other embodiments, a RCB may be a master, and two or more other RCBs may be slaves. The first self-annealing circuit block comprises various electrical components and interconnects below the µbumps 1-6 on the bottom portion of FIG. 4 excluding the system logic portion 440 of the first die 402, and the second self-annealing circuit block comprises various electrical components and interconnects above the µbumps 1-6 on the top portion of FIG. 4 excluding the system logic portion 442 of the second die 404. The first and the second self-annealing circuit blocks may further be jointly divided into five slices wherein the first slice comprises, for example, the MUX 410a, the OR gate 412a, the three-state buffer 414a, the register 416a, the weak pull-up 420a connected to resistor 418a, and the pull-down transistor 422a of the second self-annealing circuit block, µbump 1, and the weak pull-up transistor 426a connected to the resistor element 424a, the pull-down transistor 428a, register 430a, OR gate 432a, MUX 434a, and the output buffer 436a of the first self-annealing circuit block. The output of the output buffer 436a drives the system logic portion 440. Pull-up transistors 420a-420e of the second self-annealing circuit block and 426a-426e of the first self-annealing circuit block are weak because they are connected to power through their respective resistor elements (418a-418e in the first self-annealing circuit block and 424a-424e in the second self-annealing circuit block.) In some embodiments, these weak pull-up transistors are respectively controlled by the global signals (MPU) from RCB 406 and RCB 408, and the pull-down transistors 422a-422e and 428a-428e are respectively controlled by global signals (MPD) from RCB 406 and RCB 408. In some embodiments, each of the registers 416a-416e and 430a-430e may be implemented using a latch.

It should be noted that in this exemplary apparatus, µbump 3 is depicted in dotted line indicating that it represents a faulty µbump. RCB 406 includes a master/slave select pin 460, and RCB 408 includes a master/slave select pin 462. In this exemplary apparatus illustrated in FIG. 4, the RCB 406 and the RCB 408 are architecturally identical but behave differently. A master-and-slave relationship between the RCB 406 and RCB 408 may be established by connecting one of the master/slave select pins 462, 460 (462 in the illustrated example) to a voltage (e.g., Vcc), and the other one of the master/slave select pins 462, 460 (460 in the illustrated example) to ground (GND). In some embodiments, the RCB 408 is used to control the second self-annealing circuit block that interfaces with the system logic portion 442 of the second die that serves as the input for the multi-die device, while RCB 406 is used to control the first self-annealing circuit block that interfaces with the system logic portion 440 of the first die that serves as the output for the multi-die device although RCB 406 and RCB 408 may be architecturally identical. RCB 406 and RCB 408 may also comprise their respective internal oscillators that operate at different frequencies although the two internal oscillators may be structurally and architecturally identical to each other. The difference in the internal oscillator frequencies may be based on, for example, the process corner of the respective die in some embodiments.

For a slice that includes the missing µbump 3, Mux 410c receives input from the system logic portion 442, and a select signal from the OR gate 412c. The three-state buffer 414c drives the missing µbump 3 based on the output of the Mux 410c and also based on a global control signal (MOE) from RCB 408. The missing µbump 3 is connected to the pull-down transistor 422c that is controlled by the global signal (MPD) from RCB 408. The missing µbump 3 is also connected to a weak pull-up transistor 420c that is controlled by the global signal (MPU) from RCB 408. The MPU and MPD signals from RCB 408 also similarly controlled the other weak pull-up transistors 420a, 420b, 420d, 420e, and the pull-down transistors 422a, 422b, 422d, 422e respectively. The register 416c receives the data (D) input from the missing µbump 3, and its output (Q) goes to the OR gate 412c. The register 416c also receives the reset signal (R) and the clock signal (G) from the master reset signal (MR), and the master clock signal (MG) from RCB 408, respectively. The OR gate 412c receives input from register 416c and the OR gate 412b of another slice in the exemplary apparatus illustrated in FIG. 4 due to the arrangement (e.g., location) of the redundant µbump 6. The output of the OR gate 412c drives Mux 410c's select signal and further drives the OR gate 412d of another slice due to the arrangement of the redundant µbump 6 in some embodiments.

For this particular slice including the missing µbump 3, the missing µbump 3 is further connected to the pull-down transistor 428c and the weak pull-up transistor 426c that is connected to the resistor element 424c. The weak pull-up transistor 426c is controlled by the control signal (MPU) from RCB 406, and the pull-down transistor 428c is controlled by the control signal (MPD) from RCB 406. The MPU and MPD signals from RCB 406 also similarly controlled the other weak pull-up transistors 426a, 426b, 426d, 426e and the pull-down transistors 428a, 428b, 428d, 428e respectively. The OR gate 432c provides the data (D) input for register 430c, and the output of OR gate 432c drives OR gate 432d and Mux 434c. The output of Mux 434c drives the output buffer 436c whose output further drives the system logic portion 440 of the first self-annealing circuit block. The various components in the other slices such as the registers 430a, 430b, 430d, 430e, the OR gates 432a, 432b, 432d, 432d, the multiplexers 434a, 434b, 434d, 434e, the output buffers 436a, 436b, 436d, 436e also function similarly as those described with respect to the slice including the missing µbump 3. The redundant slice 448 including the redundant µbump 6 includes an extra three-state buffer 452 that drives the redundant µbump 6 and an extra Mux 450 that provides an output to the three-state buffer 452.

During operation, RCB 406 and RCB 408 respectively monitor the power to the first die 402 and the second die 404. When RCB 406 determines that the power to the first die 402 is good, and when RCB 408 determines that the power to the second die 404 is good, each will drive the Good signal (GD)

to Z (high impedance) through µbump 8. The Good signal will be driven LOW and stays LOW as long as RCB 406 or RCB 408 determines that the power to the respective die is not good. Nonetheless, as soon as the power is determined to be good to both the first die 402 and the second die 404, the Good signal will be Z. The weak pull-up resistors (one at each of the dies 402, 404) are then enabled to drive µbump 8 to "1". In some cases where the power to either the first die 402 or the second die 404 is determined to become not good, the Good node 8 will be pulled low, and RCB 406 and RCB 408 reset. Once the Good signal is a "1", both RCB 406 and RCB 408 sample their respective master/slave(s) inputs 462, 460 to determine which RCB is the master, and the other is the slave. The master RCB drives the Start signal via µbump 7, and the slave RCB drives a Z and uses the Start signal from the master as an input. The master RCB then goes through the POR annealing process based on a fixed time period based on its own internal oscillator period, and the slave RCB uses the Start signal from the master RCB to make its state transitions and works at a rate set forth by the master RCB. FIG. 5 illustrates the state table for RCB 406 and RCB 408, where the upper row represents the master mode, and the lower row indicates the slave mode.

If both RCB 406 and 408 determine that the power to the first die 402 and the second die 404 is good, RCB 406 and RCB 408 drives the master reset signal (MR) to initiate the self-annealing process to reset the registers 416a-416e and 430a-430e. RCB further drives the global control signal (MOE) to disable three-state buffers 414a-414e on the second self-annealing circuit block. Assuming that RCB 408 is determined to be the master, and RCB 406 is determined to be the slave, RCB 408 then drives the control signal (MPD) to enable the pull-down transistors 422a-422e, and RCB 406 drives another control signal (MPU) to enable the weak pull-up transistors 426a-426e. Then RCB 406 pulses the clock signal (MG) to write redundancy values in the registers 430a-430e based on the condition of the µbumps in some embodiments. For example, RCB writes a "0" for slices in which the µbumps are good and a "1" for slices in which the µbumps are faulty. In this example illustrated in FIG. 4, RCB 406 writes a "0" to registers 430a, 430b, 430d, 430e, and a "1" to register 430c.

After the writing operation, the RCB 408 then disables the pull-down transistors 422a-422e, and the RCB 406 then disables the weak pull-up transistors 426a-426e.

The slave RCB 406 then drives a control signal (MPD) to enable the pull-down transistors 428a-428e, and the master RCB 408 drives another control signal (MPU) to enable the weak pull-up transistors 420a-420e. This drives the inputs of registers 416a-416e with a "0" if µbumps are good and a "1" if the µbumps are missing. Then the master RCB 408 pulses the master signal (MG) to latch or store the redundancy values in the registers 416a-416e. In this example, the redundancy values for registers 416a, 416b, 416d, 416e are "0", and the redundancy value for register 416c is a "1". After the tests are completed, RCB 406 and RCB 408 disable all weak pull-up transistors 420a-420e and 426a-426e, and all pull-down transistors 422a-422e, and 428a-428e, and drive the global control signals (MOE) to enable the three-state buffers 414a-414e.

The apparatus 400 may then determine which µbumps are to be used based on the registers and the OR gates on the first and the second self-annealing circuit blocks in some embodiments. For each slice in this exemplary embodiment illustrated in FIG. 4, the µbump to be used is determined based at least in part on the value in the register of the slice and the OR gate to the left of the slice. For example, the µbump to be used for the slice including the missing µbump 3 is determined based at least in part upon the value stored in the register 416c, and/or the OR gate 412b in the slice to the left, for the second self-annealing circuit block. Moreover, the µbump to be used is determined by the value stored in the register 430c and/or the OR gate 432b for the first self-annealing circuit block. In this exemplary embodiment illustrated in FIG. 4, when OR gate 412c is a "1" or register 416c is a "1", Mux 410c chooses the system logic input to the left to enable redundancy and sends a "1" to the slice to the right to enable redundancy. When OR gate 412c is a "0" and register 416c is a "0", Mux 410c chooses the system logic input and sends a "0" to the slice to the right to indicate that there is no cascading redundancy. In these embodiments as illustrated in FIG. 4, if redundancy is enabled in any of the five registers 416a-416e on the second die 404, µbump 6, Mux 450, and the three-state buffer 452 are enabled for redundancy such that the functionality of the missing µbump 3 is replaced with that of µbump 4, the functionality of µbump 4 is replaced by that of µbump 5, and the functionality of µbump 5 is replaced by that of the redundant µbump 6.

In the exemplary embodiment illustrated in FIG. 4, the second die 404 serves as the input die for the multi-die device, and the first die 402 serves as the output for the multi-die device such that the data uni-directionally flow goes from the second die 404 via the second self-annealing circuit block, the µbumps, and the first self-annealing circuit block to first die 402. Nonetheless, the same approach may be used for bi-directional connections and also for mixed connections, where either one of the first die 402 and the second die 404 may include connections and components to serve as both inputs and outputs for the multi-die device. More details about the bi-directional and mixed connections will be provided in subsequent paragraphs with reference to various figures. Moreover, at least a part or the whole self-annealing circuit block such as the first self-annealing circuit block or the second self-annealing circuit block may be embedded in the system logic portion of the first die 402 or the second die 404 in some embodiments. For example, the redundancy multiplexer functions and their corresponding circuitry may be embedded in the RTL (register transfer level) of the corresponding system logic portion of the respective die or other part of the die rather than having dedicated circuits for these redundancy multiplexing functions in some embodiments. In addition or in the alternative, the multiplexers may be made wider such that they exhibit less area and performance impact than having a dedicated redundancy multiplexer for each slice in some embodiments. Furthermore, the weak pull-up may also be implemented in several other ways that are known to one of ordinary skill in the art. Therefore, the embodiments of the apparatus 400 should not be limited to that shown in FIG. 4, and FIG. 4 is not intended to limit the scope of various other embodiments or the scope of the claims. Also, additional circuits may be further added to read from or write into the redundancy registers.

The apparatus 400 of FIG. 4 is advantageous over that described with reference to FIG. 3 in several respects. One problem with the apparatus of FIG. 3 is that it requires non-volatile memory to control the multiplexing in of the redundant resources. As the numbers of resource requiring redundancy increases it requires more non-volatile memory. Non-volatile memory is best implemented in a confined contiguous space. In some cases, the µbump and redundant resources are distributed around a die. This may cause problems routing all the nonvolatile memory control from a central location to the redundancy multiplexers. Placing the redundancy multiplexers closer to the non-volatile memory would require longer datapath interconnect routes and unacceptable performance degradation. In either case considerable area and resources are required routing the control or datapath signals respectively. In addition, a test program must map the good and bad connections between die. This would require significant tester time, and as µBump counts increase, this would accordingly increase manufacturing cost.

Unlike the apparatus of FIG. 3, the apparatus 400 of FIG. 4 is a self-annealing redundancy system. As illustrated above, the apparatus 400 works by adding a volatile memory cell to control each redundancy multiplexer. Additional circuits are provided to each connection to do a simple test of the µBump connection during a repair sequence. The result of each µBump test is then stored in its local memory cell. A very small state machine would be added to control the power-up test and programming of the local memory cells. With this approach, the amount of global routing is very minimal, the test time is substantially reduced, and the die would not need costly non-volatile memory process steps to support redundancy. Finally the redundancy multiplexer and memory can be placed based on the datapath location resulting in minimal performance degradation of the datapath. It is critical that power is sufficiently stable for reliable testing and programming. In addition the self-annealing approach utilized in the apparatus 400 allows for continuous evaluation of the uBump functionality and the correction of spontaneous faults that can arise from various environmental and mechanical mechanisms.

Also, the technique of not using non-volatile memory to enable redundant resources such as the redundant µbump(s) and the extra drivers and multiplexers offers many other benefits. In these embodiments, testing the integrity of µbumps does not require external tester and test time to determine redundancy non-volatile memory values and time to program the non-volatile memory. The methods and apparatus disclosed herein allow the amount of redundancy such as the redundant µbumps and extra drivers and multiplexers to vary across a die. The methods and apparatus further perform self-repair even after the multi-die device has been deployed in the field and has been used for some time because the methods and apparatus allow for a unique redundancy latch in some embodiments. The methods and apparatus described herein also allow the multi-die device to test itself for faulty µbump(s) at any time and in an effective manner.

The methods and apparatus further require no optimization or compression which has been widely used in redundancy control circuitry including non-volatile memory and has been generally known to be less able to repair all bad modules. The methods and apparatus further provide the benefit of requiring no uniform rate of redundancy across a die as opposed to other methods or apparatus involving non-volatile memory for redundancy multiplexing that usually requires a uniform rate of redundancy across a die. In some embodiments, the methods or system described herein allow for re-determination of redundancy in the field by resetting and re-initiating the redundancy circuitry by, for example, driving the "Good" signal to a "0" and then releasing it as described above. In these embodiments, the methods or the apparatus are particularly useful for connection wear-out, SEU (single event upset) concerns, environment induced failures, and intermittent failures. The methods or the apparatus may also correct connection problems caused by, for example, temperatures and voltages that are different at certain point in time than the start-up conditions in some embodiments. To address the single event upset, embodiments of the method or the apparatus allow for disabling redundancy by, for example, holding the "Good" signal at "0" in cases where redundancy is not needed.

In addition or in the alternative, various methods or apparatus disclosed herein may be further enhanced or mixed with a non-volatile redundancy approach by, for example, using the test time reduction feature to determine non-volatile memory map in some embodiments. Also, the self-repair nature of the methods or apparatus may be used by critical connections such as configuration and non-volatile memory programming while data-path connections may use standard non-volatile redundancy control in some embodiments. Furthermore, unlike redundancy control with non-volatile memory, the repair and test time of various methods and apparatus disclosed herein remains constant regardless of the number of µbumps in a multi-die device in some embodiments. The test time or repair time with redundancy control using non-volatile memory may increase as the number of µbumps increases. It should be noted that each redundancy multiplexer and register may be placed based on the corresponding data-path location, thereby posing minimal performance degradation of the data-path. This is contrary to the redundancy control with non-volatile memory approach that requires routing signal wires from the non-volatile memory to each multiplexer, which poses much more severe performance degradation.

Figure 5A:
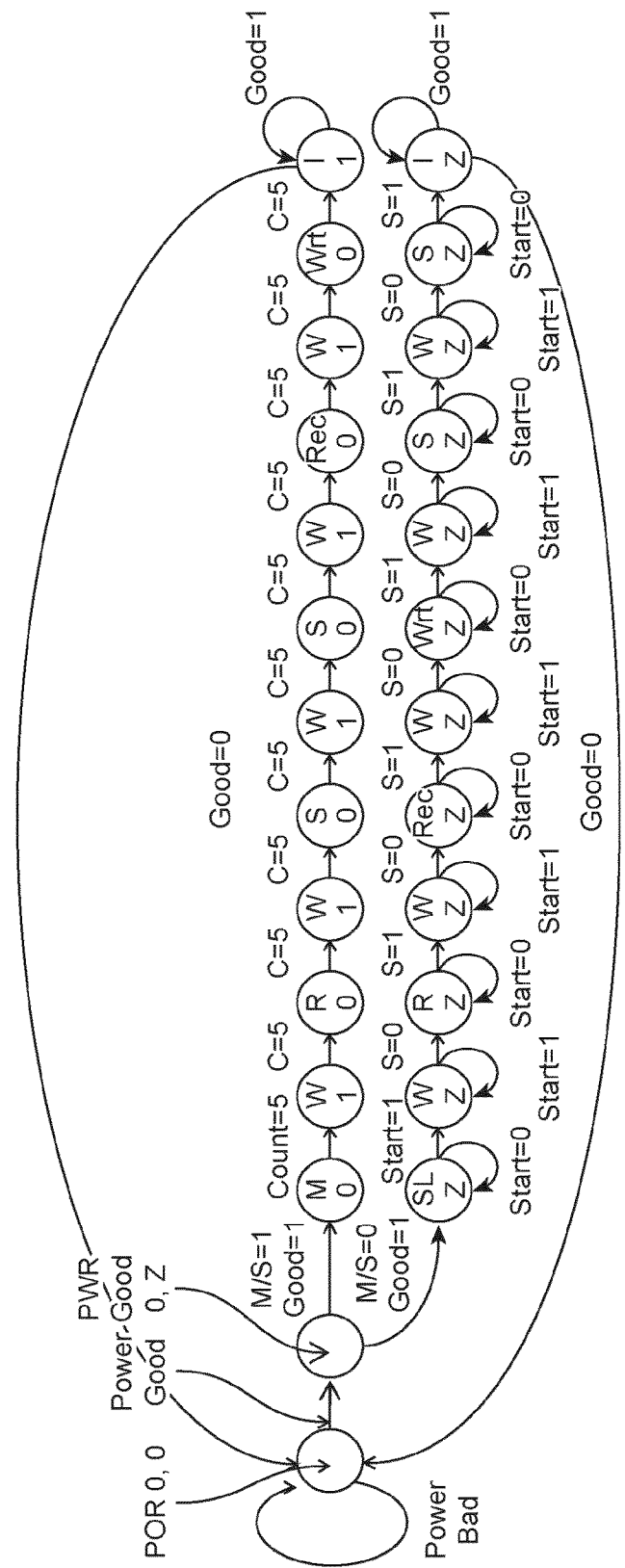
FIG. 5A illustrates the state table for repair control blocks, where the upper row represents the master mode, and the lower row indicates the slave mode in accordance with some embodiments.

FIG. 5A illustrates a state table for repair control blocks RCB 406 and RCB 408, where the upper row represents the master mode, and the lower row indicates the slave mode in some embodiments. In FIG. 5A, the Good="0" resetting the state machine is only shown for the idle states. When Good="0" in any state, the state machine goes back to POR. These paths are, however, not shown to make FIG. 5A easier to read. In each state bubble, the "Start" output value is shown below the state name. When Start=Z, Start is an input to the state machine. When in the master mode as indicated in the top row, the state transitions are based on a fixed number of internal oscillator clock cycles. The wider the possible internal oscillator variation with PVT (process, voltage, or temperature), the more cycles are required for the master and the slave RCBs to synchronize. In some embodiments, the number of master mode cycles per state must allow for three clock cycles in each slave state when the master is operating at the maximum frequency and the slave at the slowest frequency. Nonetheless, the 5/3 ratio in this example works for an oscillator with ±25% variation over process, temperature, and voltage. Other ratios may be used in other embodiments.

In slave mode as indicated in the bottom row, the state transitions are set by the Start input that comes from the master RCB. This makes the time in each state approximately equal to that of the master less some variation due to the asynchronous nature of the two internal oscillators. In FIG. 5A, each instance of Wait (W), Send (S), or Idle (I) constitutes a unique state.

FIG. 5B illustrates a self-annealing µbump redundancy repair control state machine output function table (Table 1) in accordance with some embodiments. More specifically, Table 1 shows the signal outputs for each state in these embodiments. All states in Table 1 with the same label behave the same in some respects even though these states are unique states. In the Write (Wrt) state, the master clock (MG) signal is shown as ⎍ that indicates that the MG signal will be pulsed high to latch data for one clock cycle. The wave form will be low for one cycle, high for one cycle, and low for the remainder of the state. This represents the action that sets the slave three clock cycle requirement that is used to determine the period of the master states. The Wait (W) state is used multiple times for simplicity. The Wait (W) states signals MPU and MPD are described as "Last" in Table 1 implying that the state of these outputs are determined by the value in the last state.

FIGS. 6A-6B illustrate an exemplary repair implementation on the input side in some embodiments. More specifically, FIG. 6A illustrates a series of µbumps, each of which is connected to a corresponding Mux that receives an input from a configuration random access memory (CRAM) bit value 602 for enabling redundancy. A CRAM may be used to control configuration of FPGA (field-programmable gate array). The output of the multiplexers drives the respective output buffers. In this exemplary embodiment, CRAM bit value "1" indicates enabling redundancy, and all µbumps are intact and fully functional as intended. The self-annealing circuit block with redundancy control includes an extra µbump 604 as illustrated in FIG. 6A.

FIG. 6B illustrates a similar self-annealing redundancy circuit block that includes a faulty µbump 606 (e.g., missing µbump) and a redundant µbump 608. By using the methods or apparatus disclosed herein, it can be seen that the CRAM bit values at the first three multiplexers from the left are "0" indicating no cascading redundancy, and that the CRAM bit values 612 for Mux connected to the faulty µbump 606 and the multiplexers connected to the remaining µbumps are "1" indicating redundancy is enabled where the apparatus uses the extra µbump (and its corresponding driver, etc.) to replace the functionality of the µbump to its immediate left. The replacement of the µbump's functionality continues until the functionality of the faulty µbump 606 is replaced by that of the µbump to the right of the faulty µbump 606.

Figure 7A:
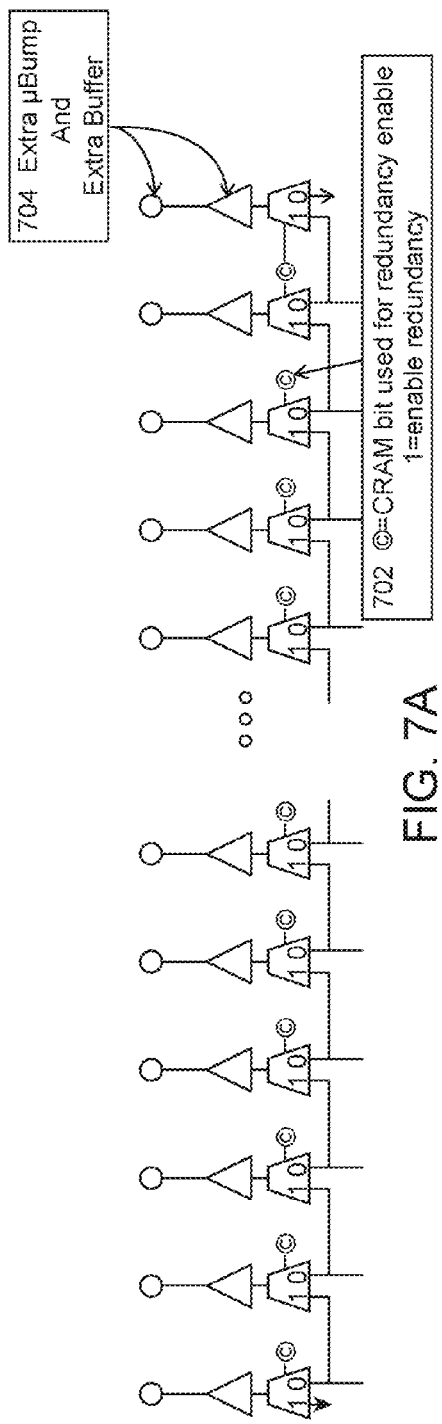
FIGS. 7A-B illustrate an exemplary repair implementation of a μbump in accordance with some embodiments.
Figure 7B:
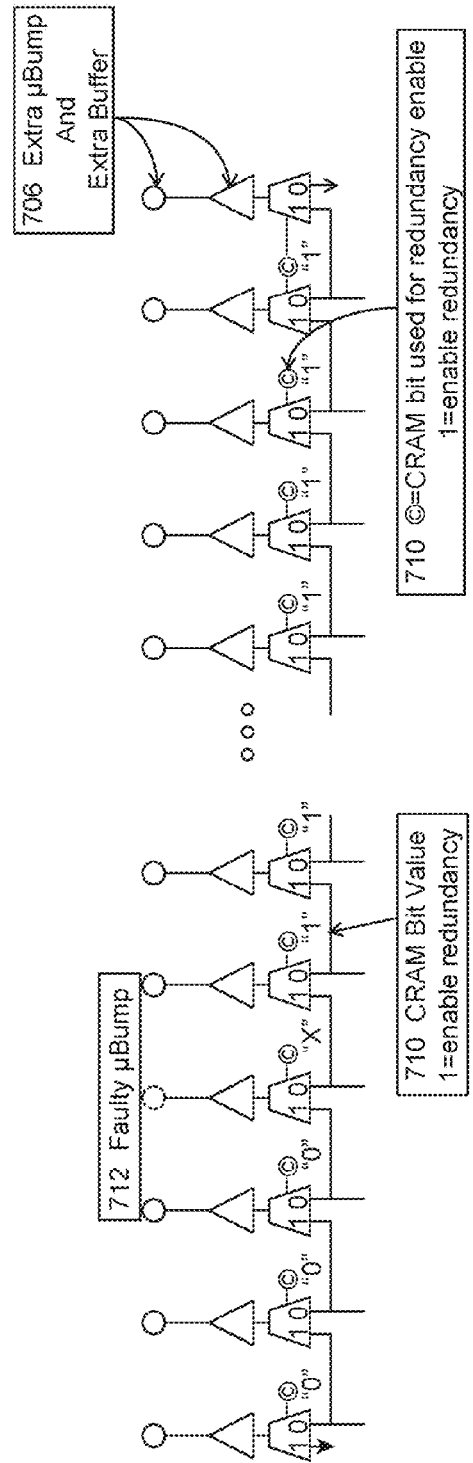

FIGS. 7A-7B illustrate an exemplary repair implementation on the µbump outputs in accordance with some embodiments. More specifically, FIG. 7A illustrates a series of µbumps, each of which is connected to a corresponding output buffer that is driven by the respective Mux which receives an input from a configuration random access memory (CRAM) bit value 702 for enabling redundancy. In this exemplary embodiment, CRAM bit value "1" indicates enabling redundancy, and all µbumps are intact and fully functional as intended. The self-annealing circuit block with redundancy control includes an extra µbump and the extra driver (the output buffer) 704 as illustrated in FIG. 7A.

FIG. 7B illustrates a similar self-annealing redundancy circuit block that includes a faulty µbump 712 and a redundant µbump and extra driver (e.g., an output buffer as illustrated) 706. By using the methods or apparatus disclosed herein, it may be seen that the CRAM bit values 710 at the first three multiplexers from the left are "0" indicating no cascading redundancy, and that the CRAM bit value 710 for the Mux connected to the faulty µbump 712 is "X", and the CRAM bit values 710 for the multiplexers connected to the remaining µbumps are "1" indicating cascading redundancy is enabled where the apparatus uses the extra µbump (and its corresponding driver, etc.) 706 to replace the functionality of the µbump to its immediate left. The replacement of the µbump's functionality continues until the functionality of the faulty µbump 712 is replaced by that of the µbump to the right of the faulty µbump 712.

Figure 8A:
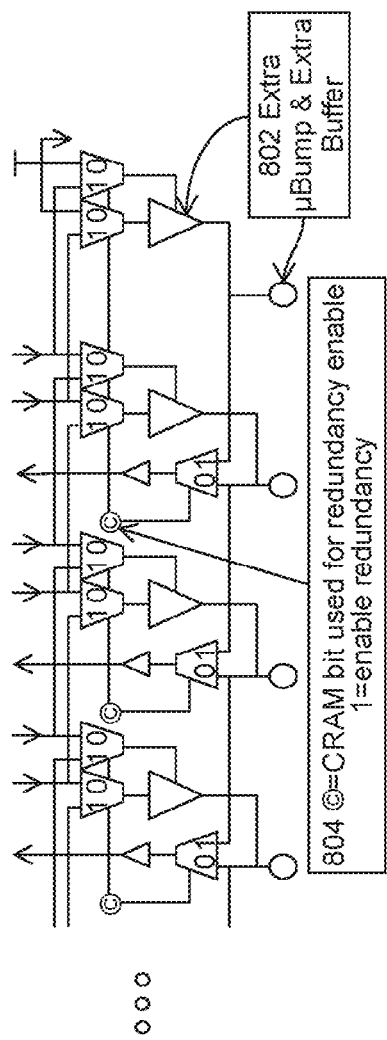
FIGS. 8A-B illustrate an exemplary repair for bi-directional implementation in accordance with some embodiments of a redundancy control block.
Figure 8A:
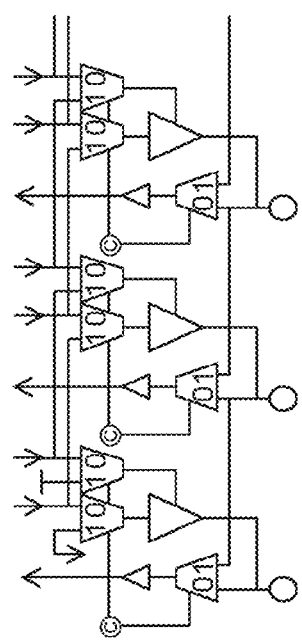
Figure 8B:
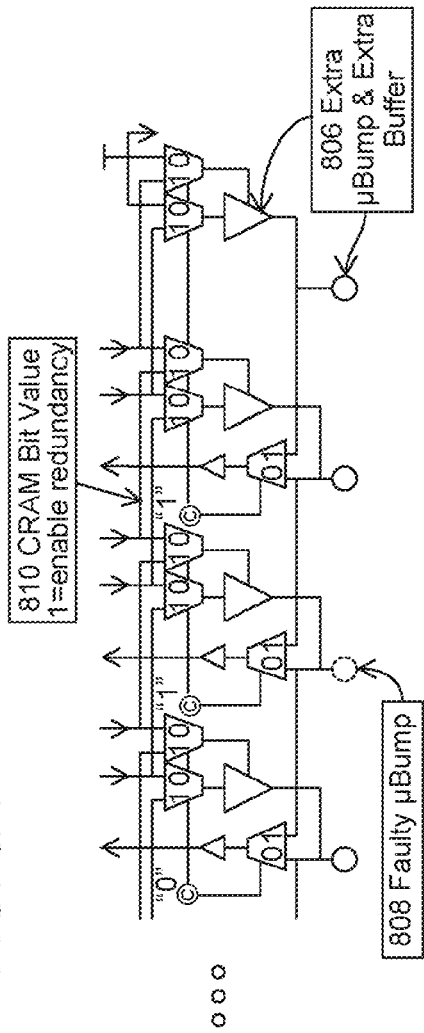
Figure 8B:
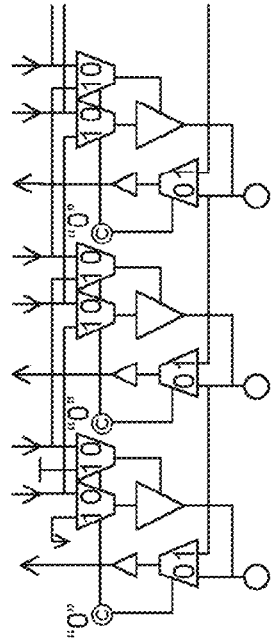

FIGS. 8A-8B illustrate an exemplary repair for bi-directional implementation in some embodiments. More specifically, FIG. 8A illustrates a series of µbumps, each of which is connected to a corresponding Mux whose output drives its corresponding output buffer. The aforementioned Mux receives a CRAM 804 bit value as an input for enabling redundancy. The bit value of the CRAM 804 is also provided to a second Mux that is connected to a third Mux for controlling redundancy and repair in a bi-directional circuit. In this exemplary bi-directional implementation, the bit value of CRAM 804 is "1" to enable redundancy and "0" to indicate no cascading redundancy. FIG. 8A further includes an extra µbump and its associated driver (e.g., a three state buffer connected to a pair of multiplexers) for redundancy and repair purposes. In this exemplary embodiment, all µbumps are intact and fully functional as intended. The self-annealing circuit block with redundancy control includes an extra µbump and the extra driver (the output buffer) 802.

FIG. 8B illustrates a similar self-annealing redundancy circuit block that includes a faulty µbump 808 and a redundant µbump and extra driver (e.g., a three state buffer connected to a pair of multiplexers as illustrated) 806. By using the methods or apparatus disclosed herein, it may be seen that the CRAM bit values 810 at the first four µbumps from the left are "0" indicating no cascading redundancy, and that the CRAM bit value 810 for the faulty µbump 808 and the remaining µbumps is "1" indicating cascading redundancy is enabled where the apparatus uses the extra µbump (and its corresponding driver, etc.) 806 to replace the functionality of the µbump to its immediate left. The replacement of the µbump's functionality continues until the functionality of the faulty µbump 808 is replaced by that of the µbump to the immediate right of the faulty µbump 808. It should be noted that the additional complexity of the circuitry shown in FIGS. 8A-8B arise from the bi-directionality of the circuitry so the input side, the output side, and the output enable element, of the faulty µbump 808 as well as of the other µbumps to the right of the faulty µbump 808 need to be rerouted or replaced.

Figure 9:
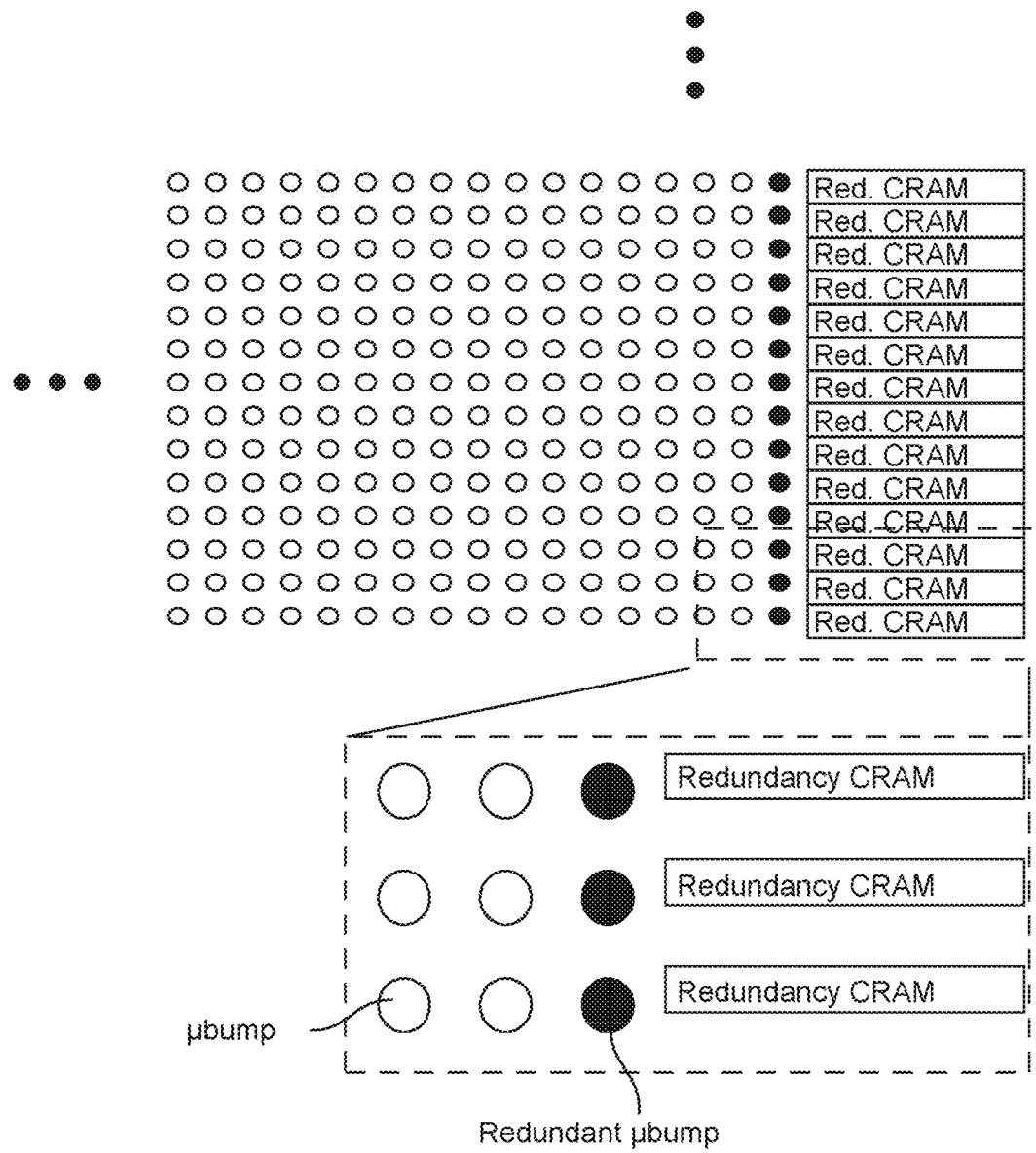
FIG. 9 illustrates a field of μbumps and some control memory that may be any combination of volatile and non-volatile memory in accordance with some embodiments.

FIG. 9 illustrates a field of µbumps and some control memory that may be any combination of volatile and non-volatile memory in some embodiments. In FIG. 9, it is shown that a redundant configuration random access memory bit (Redundancy CRAM) is used for each row of 33 µbumps. Although not shown, the illustrated embodiments may also include a redundancy eFuse (electronic fuse) next to each Redundancy CRAM (like that shown in the embodiments of FIG. 10, as will be discussed below). The black dots represent redundant µbumps where the hollow circles represent interconnect µbumps. In FIG. 9, there are 48 rows of 33 µbumps (including the redundant µbumps). In one approach with non-volatile memory, these 48 rows of 33 µbumps require 32×48 control bits for redundancy purposes. It shall be noted that although FIG. 9 and other figures in the subject Application usually show one redundant µbump per row, the number of redundant µbumps or the ratio between interconnect µbumps and redundant µbumps is determined based at least in part upon, for example, yield analysis or groupings of common types of µbumps buffers.

Figure 10:
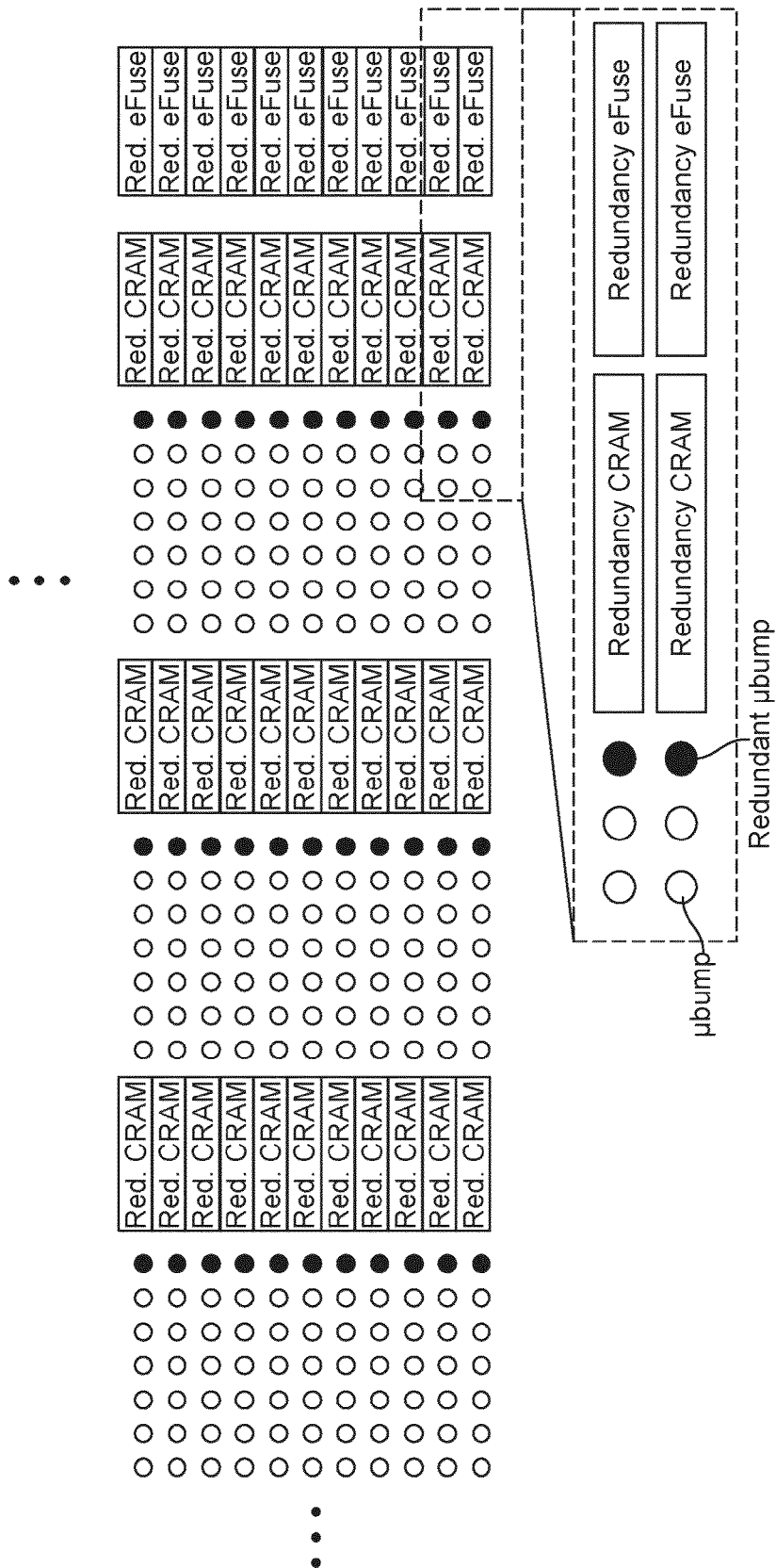
FIG. 10 illustrates an exemplary implementation of multiple redundancy control blocks by using the disclosed methods or apparatus in accordance with some embodiments.
Figure 11A:
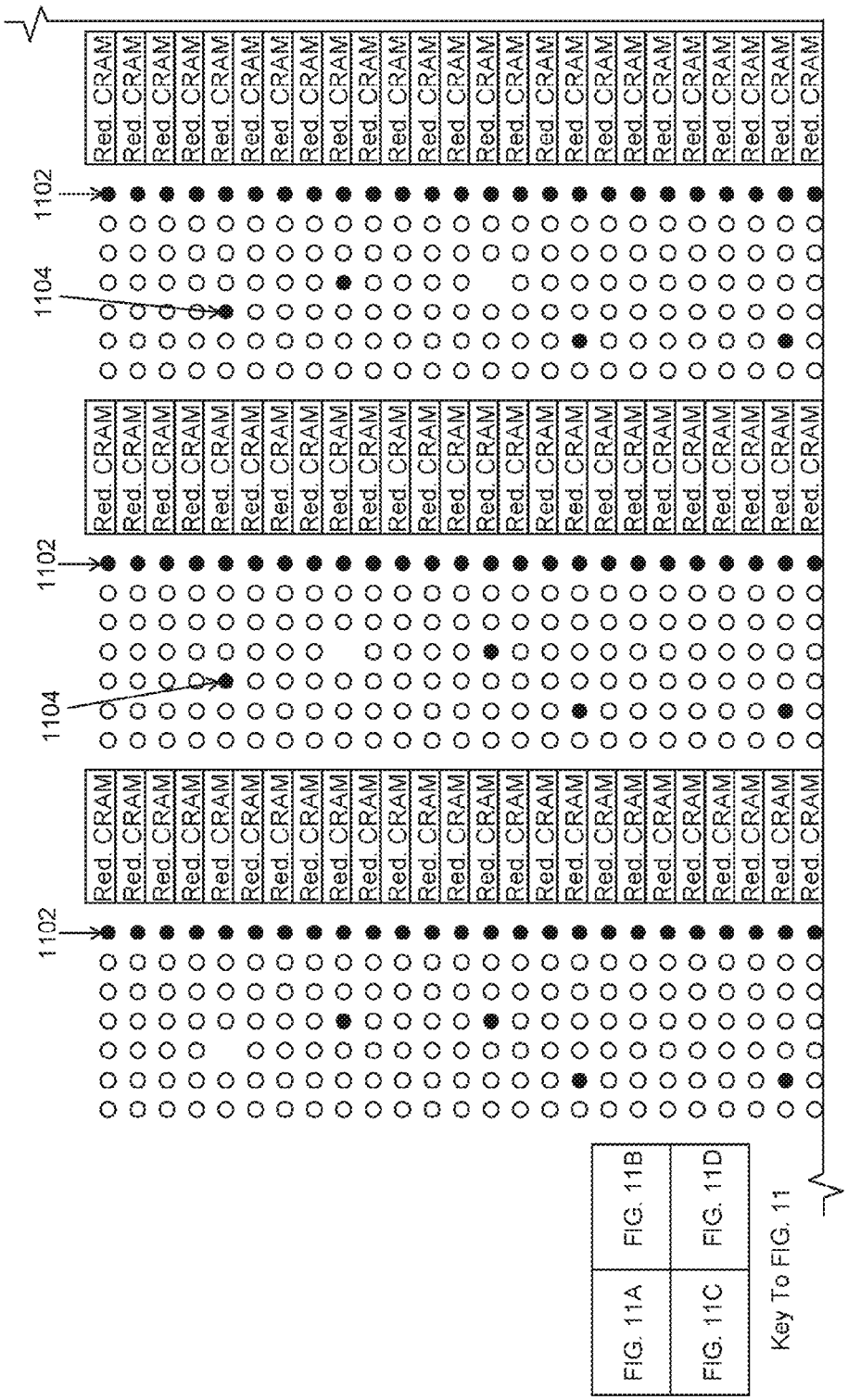
FIG. 11 (which includes FIGS. 11A-11D) illustrates various repair examples using some of the disclosed methods or apparatus in accordance with some embodiments.
Figure 11B:
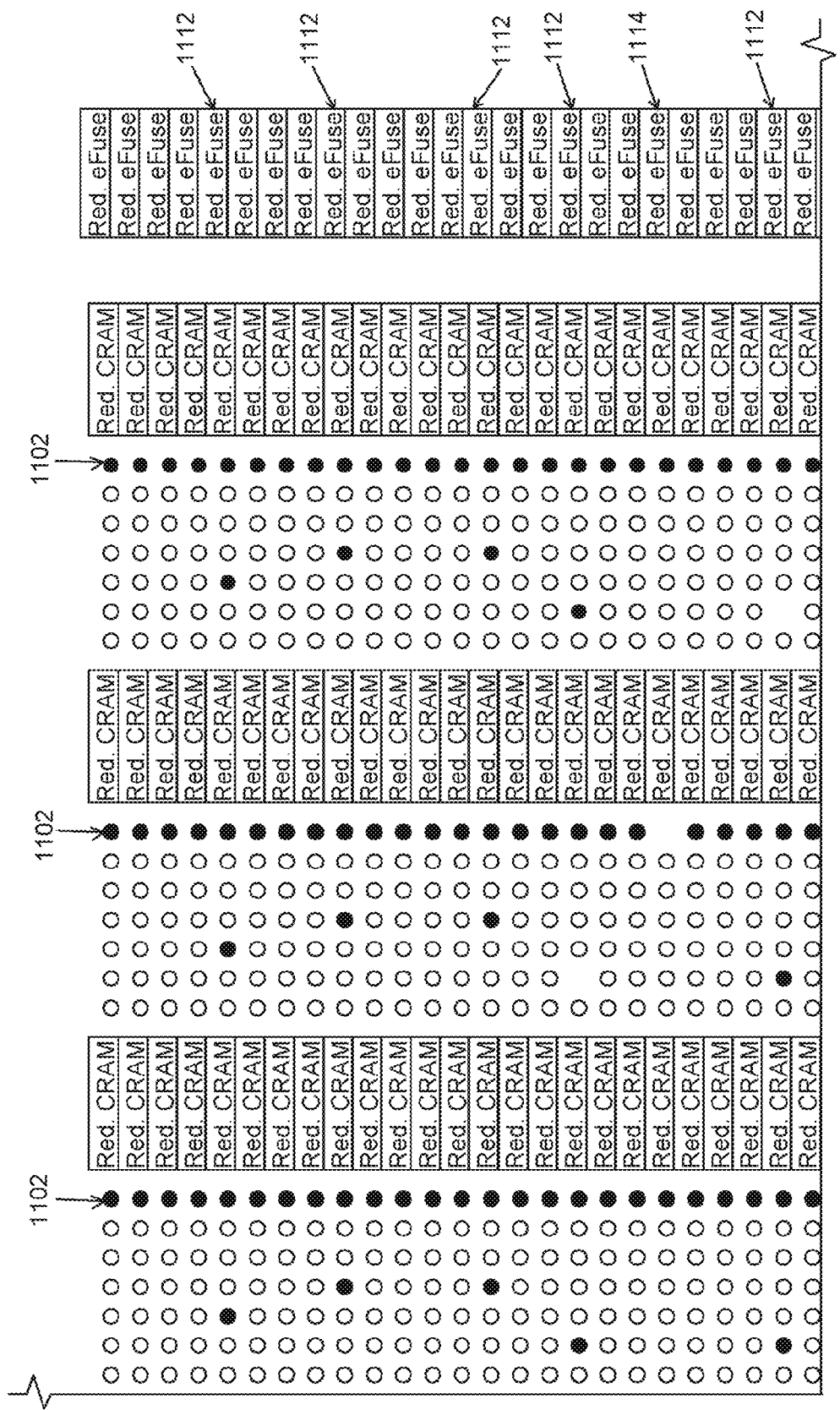
Figure 11C:
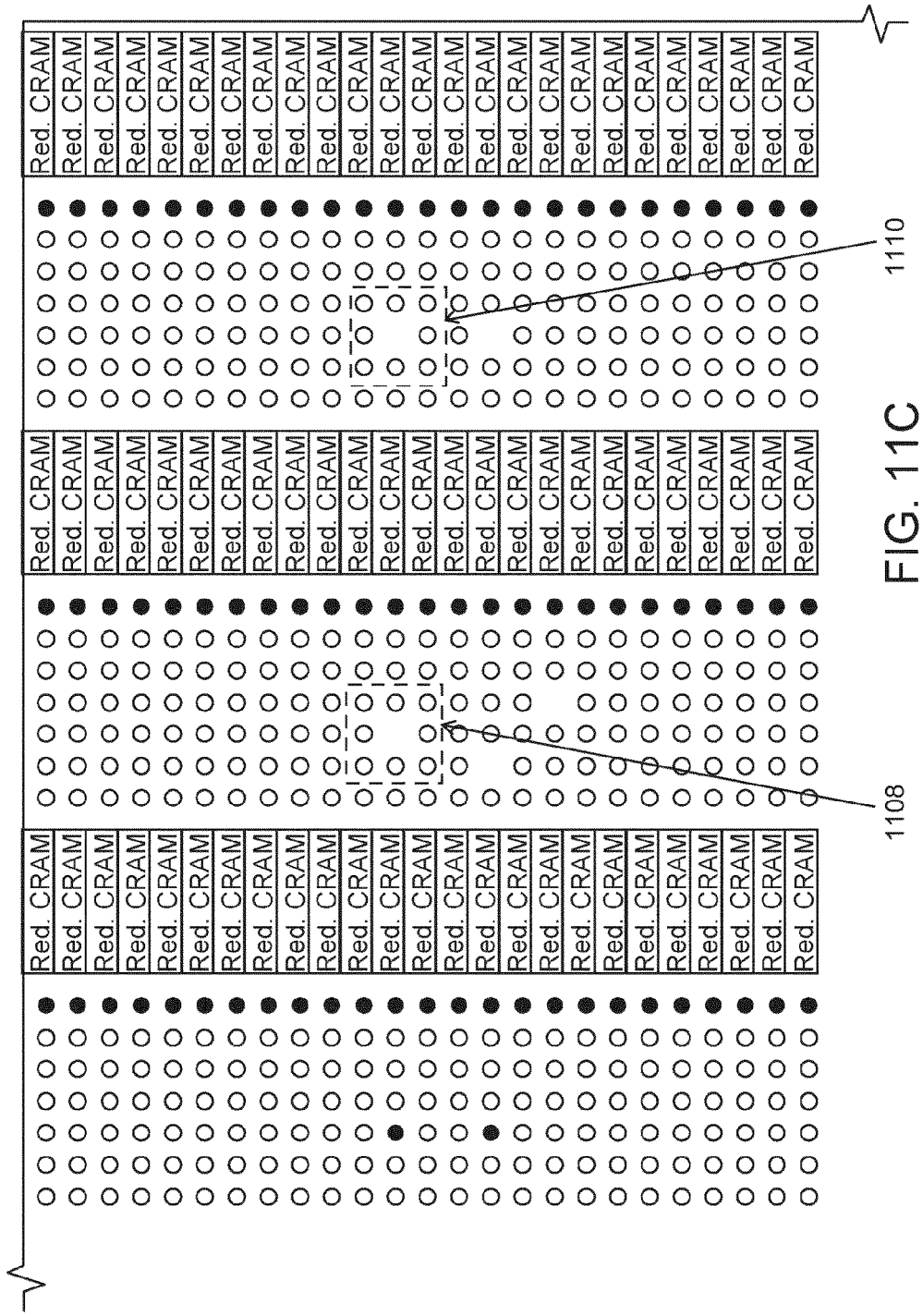
Figure 11D:
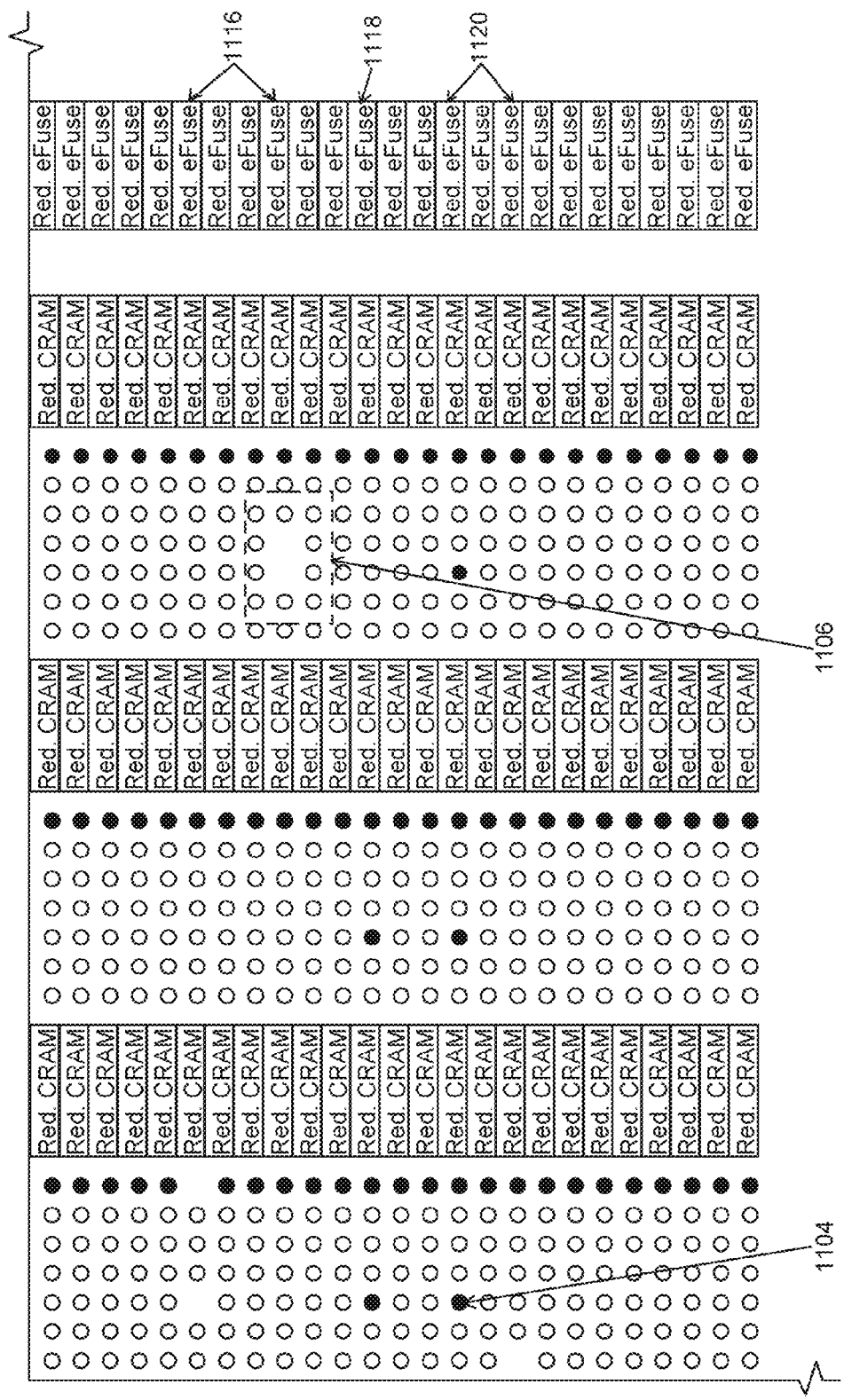

FIG. 10 illustrates an exemplary implementation of redundancy control by using the disclosed methods or apparatus in some embodiments. More specifically, FIG. 10 illustrates how fewer non-volatile bits that are loaded into volatile bits may control redundancy. In this exemplary implementation including 48 identical rows, each row includes six groups of seven µbumps that include six interconnect µbumps and one redundant µbump. FIG. 10 further illustrates that for each group of seven µbumps (six interconnect µbumps and one redundant µbump), there exists a volatile control bit (Redundancy CRAM, which may be a 6 bit Redundancy CRAM in some embodiments) for enabling redundancy. FIG. 10 further illustrates six non-volatile control bits in the form of a redundancy eFuse (electronic fuse). These six non-volatile control bits will be copied to all volatile control bits (Redundancy CRAM's) at power up. In this example with mixed volatile control bits and non-volatile bits using some embodiments of the invention, only 6×48 non-volatile control bits are needed.

If this configuration is to be implemented with non-volatile memory only, it will require 36×48 non-volatile control bits which will dramatically degrade the performance due to long routing paths between the non-volatile memory blocks and the redundancy multiplexers, and will also substantially increase the cost due to the use of much more expensive non-volatile memory.

FIG. 11 (including FIGS. 11A-11D) illustrates another repair example using some of the disclosed methods or apparatus in some embodiments. FIG. 11 shows 50 identical rows, each of which includes six groups of seven μbumps that include six interconnect μbumps and one redundant μbump. The solid dot 1102 on the right of each group of seven μbumps represents a redundant μbump. The hollow circles represent normal, functional μbumps. It can be seen that some locations 1106, 1108, 1110 have no μbumps indicating the faulty μbump situation that needs repair. The solid dots 1104 represent functional μbumps that are not used because a common redundancy word/signal is used to repair all groups in a row. The rows 1112 with one faulty μbump in each row may be successfully repaired by using some of the methods or apparatus disclosed herein. The rows 1114 with the redundant μbump missing represent the case where no repair is necessary. The rows 1116 with the redundant μbump missing and another faulty μbump represent the case where repair is not possible. It shall be noted that rows 1116 are irreparable because of the six-to-one interconnect μbumps to redundant μbump ratio, and further because of the presence of faulty μbumps in more than one location in a group of μbumps. The rows 1118 with faulty μbumps 1108, 1110 at the same location within each group represent repairable double fault. The rows 1120 represent unrepairable rows because the double fault is in different locations within the group of seven respectively. This fault would be repairable if the number of effuses equal the number of CRAM.

FIG. 12 illustrates an exemplary implementation for bi-directional signals in some embodiments. The exemplary implementation includes three pairs of μbumps 1212 in a carrier die 1206 that interfaces with first die 1202 and second die 1204. The μbump 1212 is connected to μbump 1208 through a trace on carrier die 1206. The trace from μbump 1212 to μbump 1208 on carrier die 1206 is an additional failure mechanism which can be repaired the same as a direct μbump connection, as similarly discussed herein. As shown in the figure, the apparatus uses a configuration bit 1210, which may be a CRAM bit as similarly discussed.

Figure 13A:
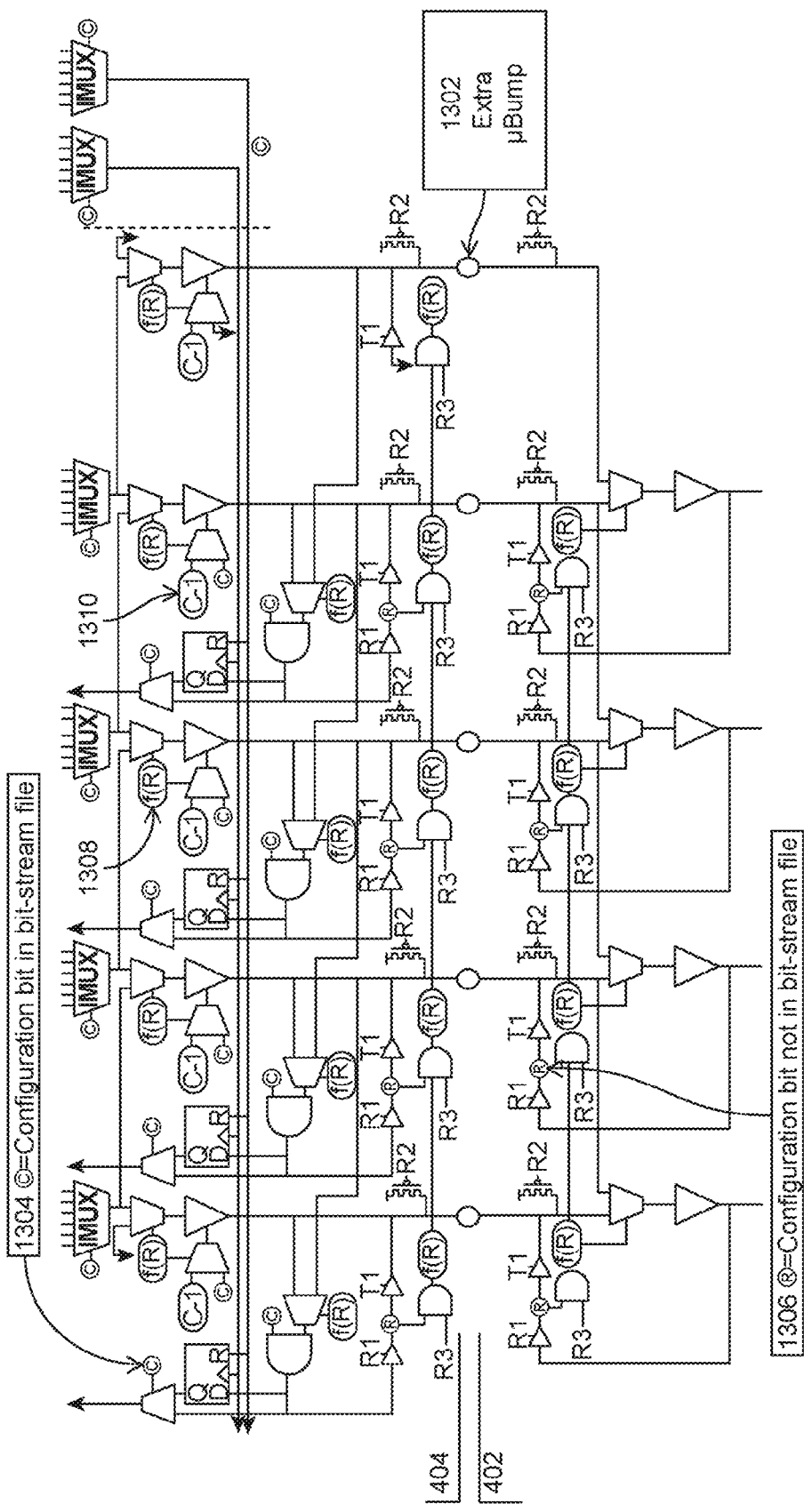
FIG. 13A-B illustrate an exemplary implementation for a multi-die device with redundancy control with bi-directional circuitry in accordance with some embodiments.
Figure 13B:
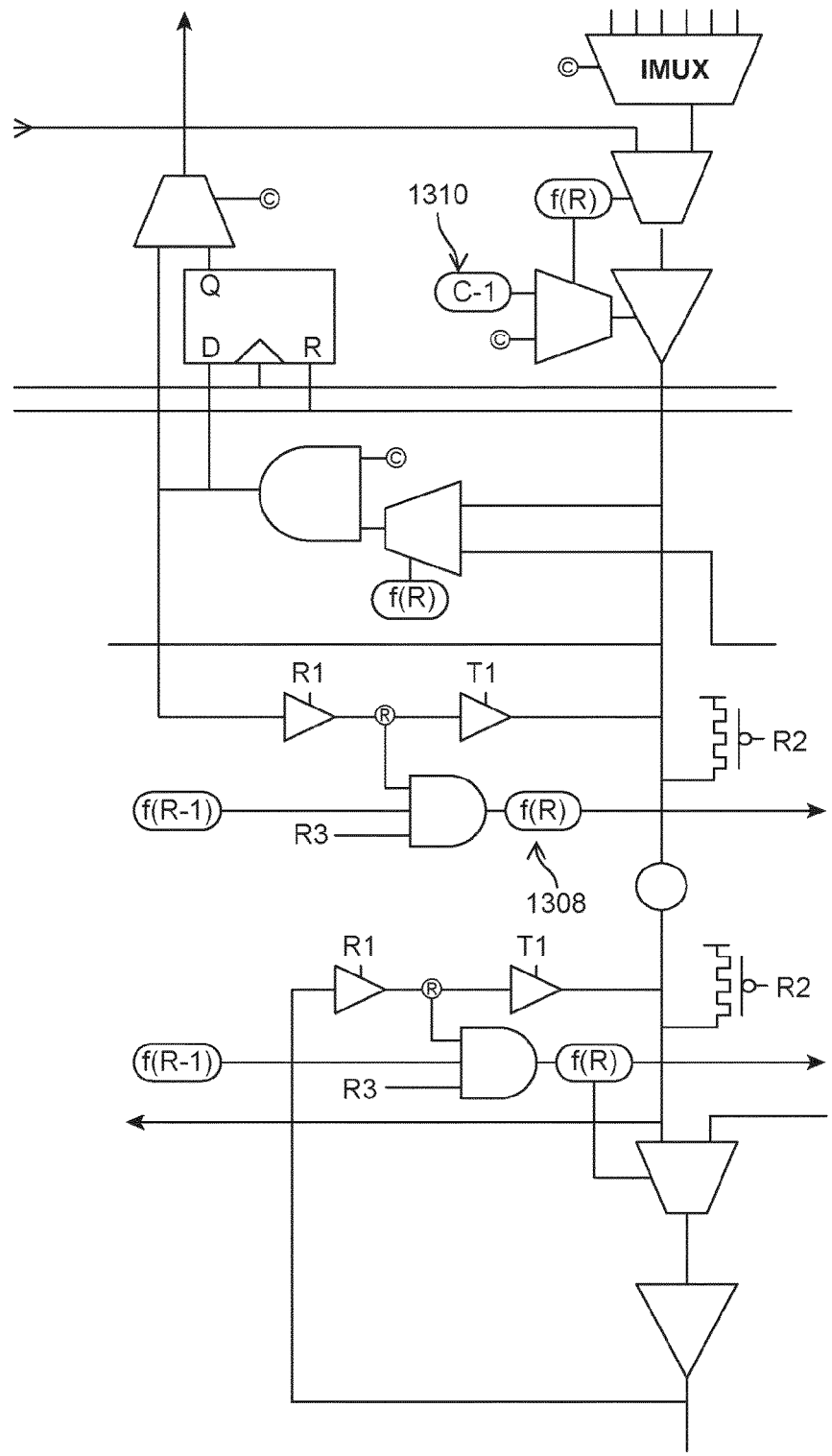

FIGS. 13A-13B illustrates an exemplary implementation for redundancy control with bi-directional signals in some embodiments. FIG. 13 may be implemented in a similar way as that disclosed with reference to FIGS. 4 and 12 with additional components to address the redundancy control due to the bi-directional nature of the signals. The exemplary implementation in FIG. 13A includes a redundant μbump 1302, while element 1304 indicates the configuration bit in the bit-stream file, and configuration bit 1306 indicates the configuration bit not in the bit-stream file. In this exemplary implementation, the fabric die is directional because the carrier die may be input or output depending on the fabric die to which the carrier die is interfacing with. In FIG. 13B, which is an exploded partial view of the device of FIG. 13A, the Mux receives a first input from a configuration bit to the left 1310 and a second input 1308 representing a function of redundancy controls and RNs (various global select signals for controlling redundancy test and programming.) In addition, FIG. 13A illustrates the redundancy control between bi-directional circuitry and input. In the illustrated embodiments, the f(R) notation in the diagram represents the function: f(R)= (f(R−1)+R)·R3. In other embodiments, the f(R) notation may represent other functions.

Figure 14A:
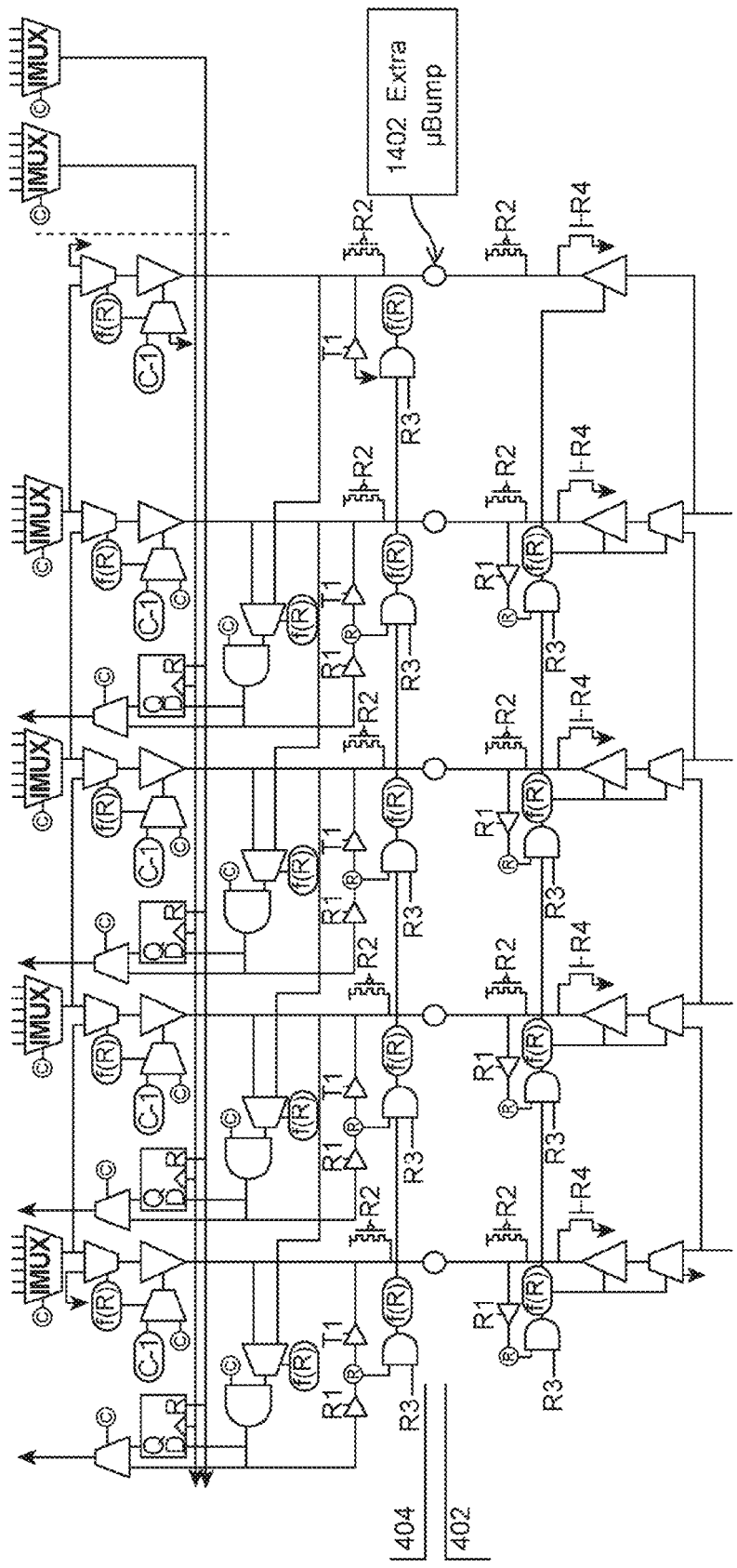
FIGS. 14A-B illustrate an exemplary implementation for a multi-die device with redundancy control with programmable bi-directional circuitry in accordance with some embodiments.
Figure 14B:
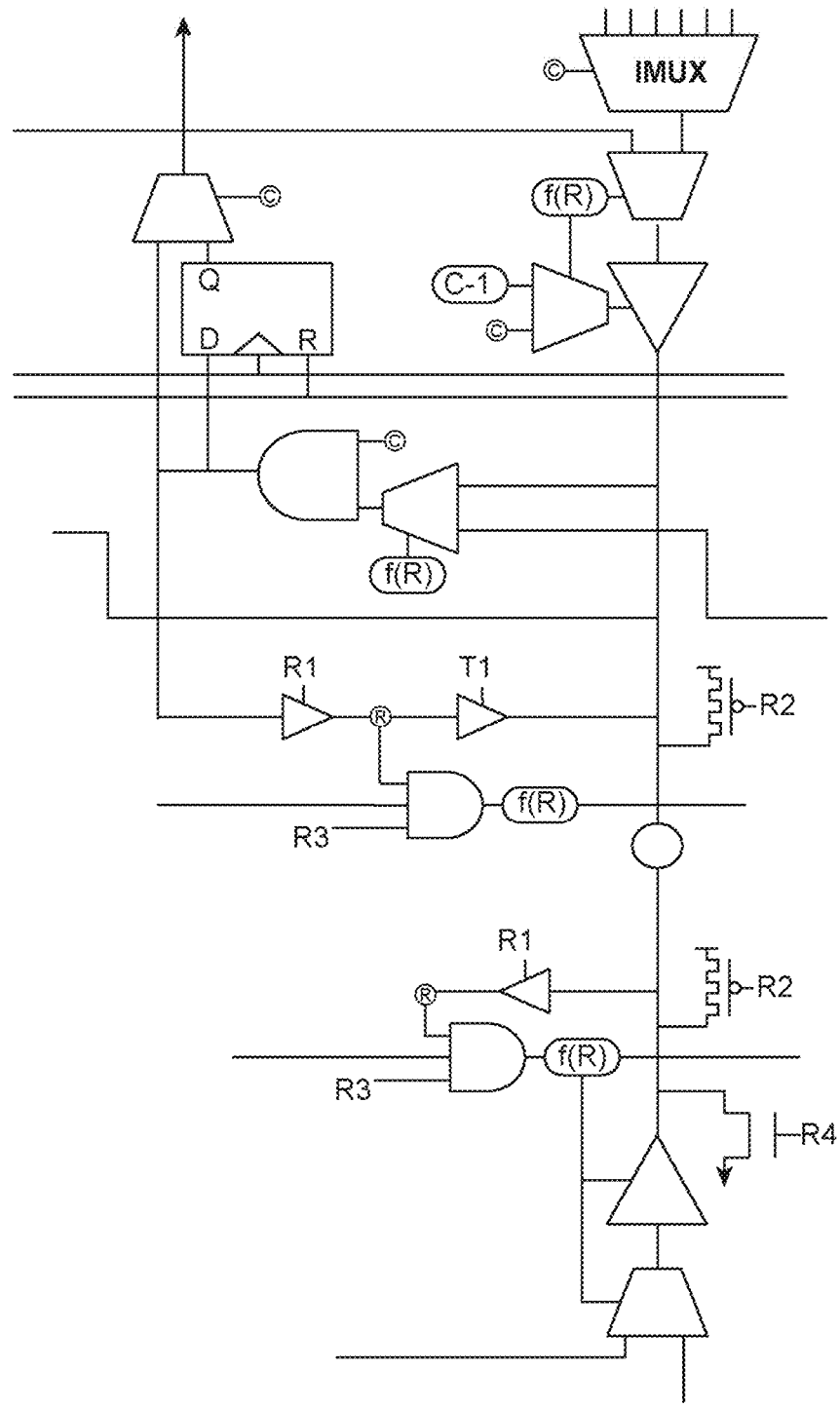

FIG. 14A illustrates an exemplary implementation for redundancy control with programmable bi-directional, registered input circuit in some embodiments. The exemplary implementation in FIG. 14A is similar to that in FIG. 13A but with programmable, bi-directional registered input circuit for redundancy control with a redundant μbump 1402. Moreover, FIG. 14A illustrates the exemplary implementation where dedicated latches are mapped to the configuration memory system. It may be seen from FIG. 14A that latches are programmed at POR for redundancy control and are configured to sense and drive μbumps. The configuration of the circuitry illustrated in FIG. 14A also allows for synchronous input vectors. In addition, the input multiplexing redundancy architecture exhibits more efficient performance due to the use of more complex small transistor circuits and fewer large transistor circuits. Moreover, the fabric die in the exemplary implementation illustrated in FIG. 14A is bi-directional because the carrier die may be input or output depending on die placement. In addition, FIG. 14A illustrates the redundancy control between bi-directional circuitry and output. FIG. 14B illustrates a blown-up view of a section of the exemplary implementation of FIG. 14A to enhance legibility and clarity. In the illustrated embodiments, the f(R) notation in the diagram represents the function: f(R)=(f(R−1)+R)·R3. In other embodiments, the f(R) notation may represent other functions.

Figure 15A:
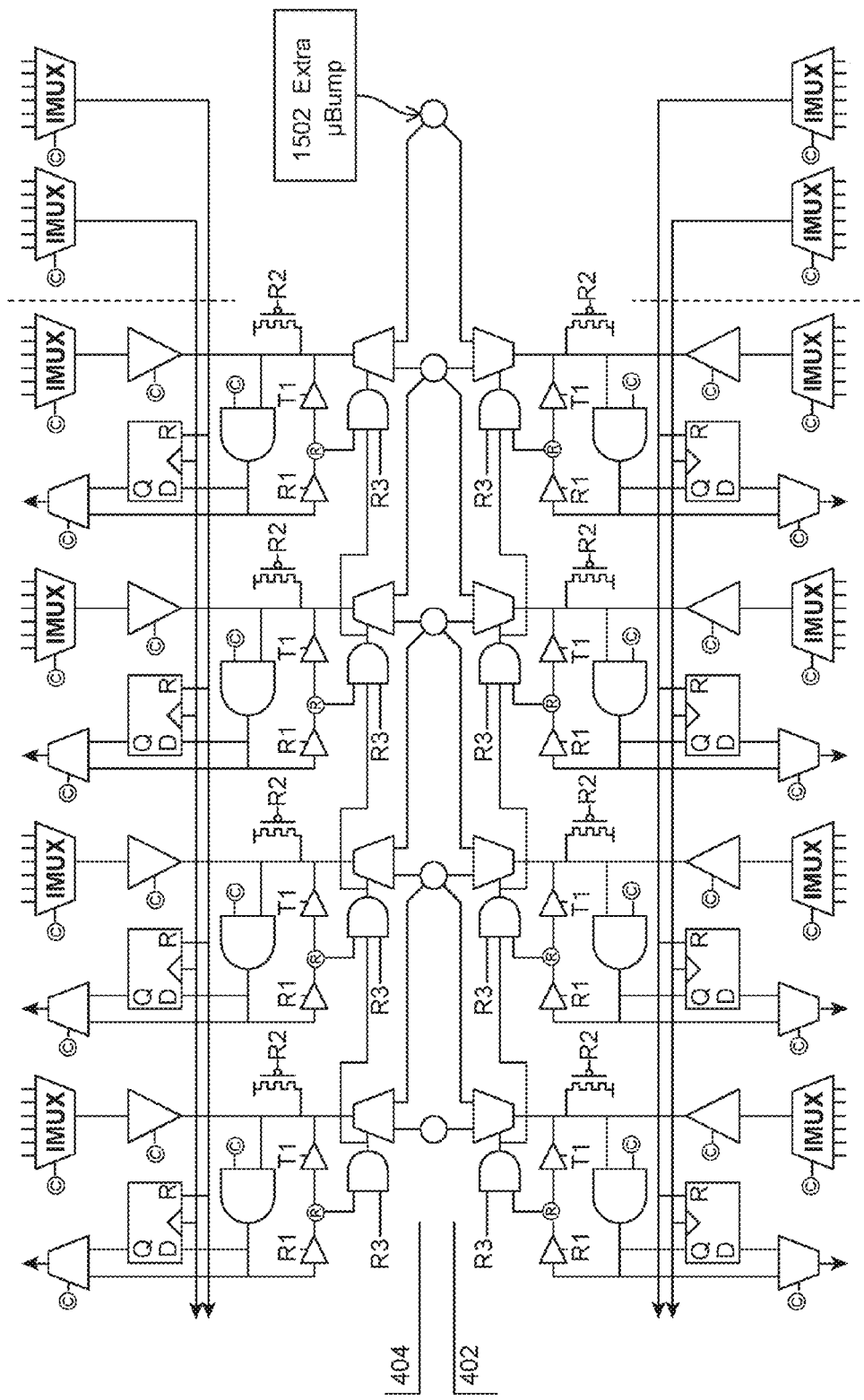
FIGS. 15A-B illustrate an alternate implementation for a multi-die device with programmable bi-directional buffers in accordance with some embodiments.
Figure 15B:
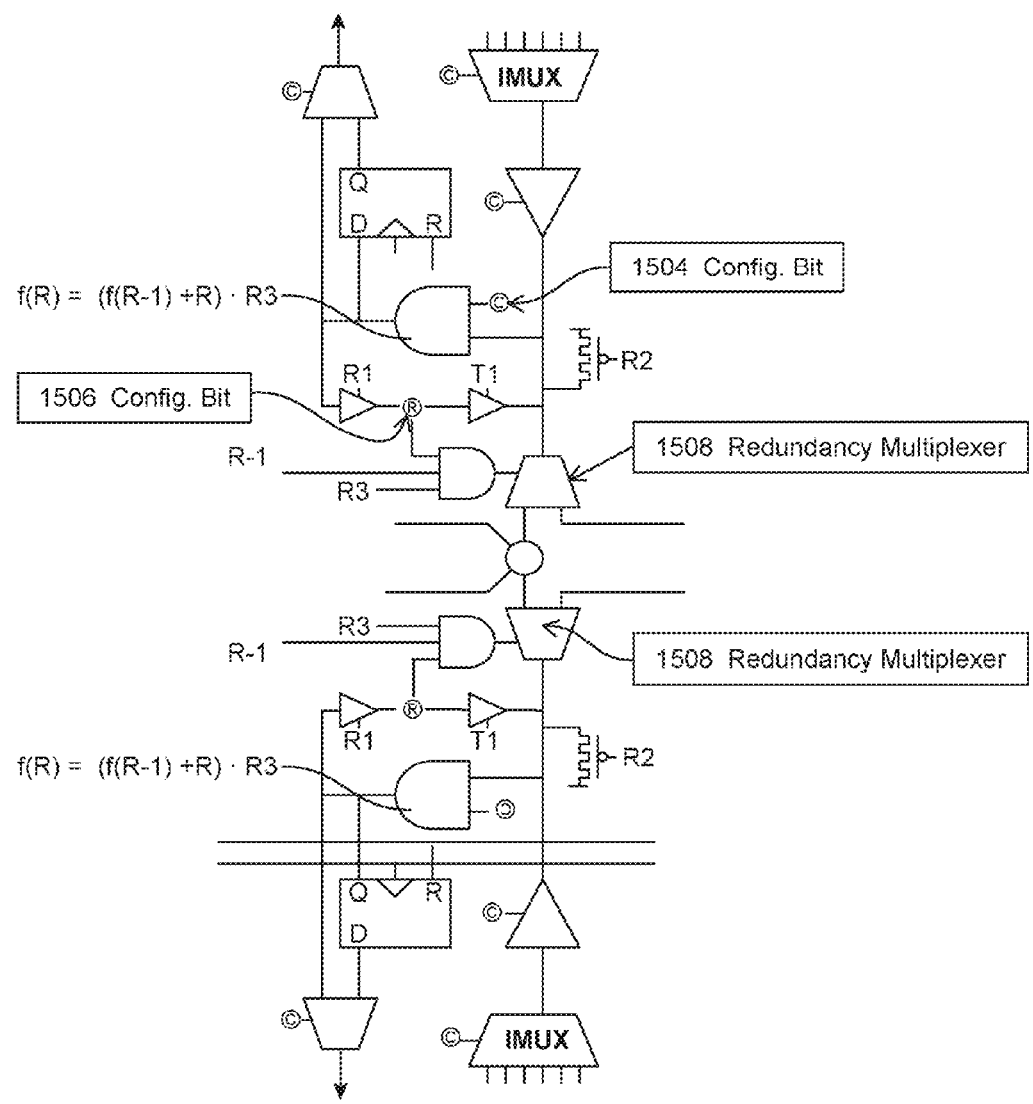

FIG. 15A illustrates an exemplary implementation with programmable bi-directional, registered input circuit in some embodiments. The exemplary implementation in FIG. 15A is similar to that in FIG. 13A but with programmable, bi-directional registered input circuit for redundancy control with a redundant μbump 1502. Moreover, FIG. 15A illustrates the exemplary implementation where dedicated latches are mapped to the configuration memory system. It may be seen from FIG. 15A that latches are programmed at POR for redundancy control, and are configured to sense and drive μbumps. The configuration of the circuitry illustrated in FIG. 15A also allows for synchronous input vectors. FIG. 15B illustrates a blown-up view of a section of the exemplary implementation illustrated in FIG. 15A to enhance legibility and clarity. FIG. 15B further illustrates the configuration bit 1504 that is in the bit-stream file and the configuration bit 1506 that is not in the bit-stream file. Also, redundancy multiplexers 1508 extending from one of the μbumps are shown in the figure. It should be noted that the embodiments of FIG. 13A and FIG. 15A are different in that the redundancy mux in the device of FIG. 13A is at the input side of the μbump buffers, while the device of FIG. 15A has multiplexers on the output side of the μbump buffers.

Figure 16:
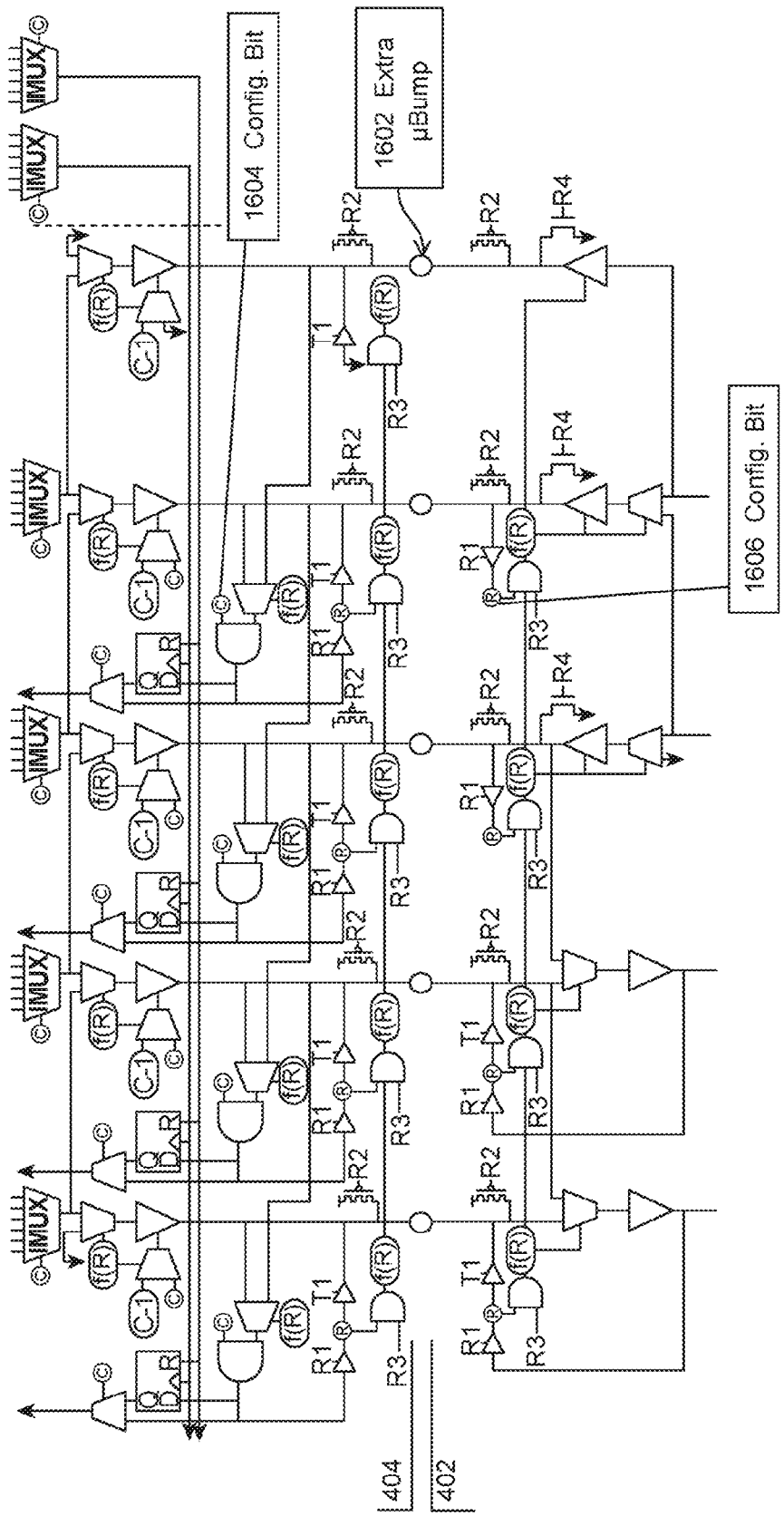
FIG. 16 illustrate another exemplary implementation of a multi-die device with redundancy control with bi-directional signals to mixed input and output buffers in accordance with some embodiments.

FIG. 16 illustrates another exemplary implementation for redundancy control with mixed, bi-directional signals in some embodiments. The exemplary implementation illustrated in FIG. 16 includes a redundant μbump 1602. The fabric die associated with the exemplary implementation illustrated in FIG. 16 is bi-directional because the carrier die may be input or output depending on die placement. In addition, the carrier die comprises a mix of inputs and outputs, where the carrier inputs are down-stream. The exemplary implementation illustrated in FIG. 16 exhibits minimal delay variation at the input/output interface. In some embodiments where there exists a mix of input and output lines, the mix of input and output lines may increase the complexity of the circuitry and delay variations. Moreover, the exemplary implementation illustrated in FIG. 16 shows the successful redundancy control in cases with bi-directional signals and a mix of inputs and outputs. In the illustrated embodiments, the configuration bit 1604 is in the bit-stream file, and the configuration bit 1606 is not in the bit-stream file.

Figure 17:
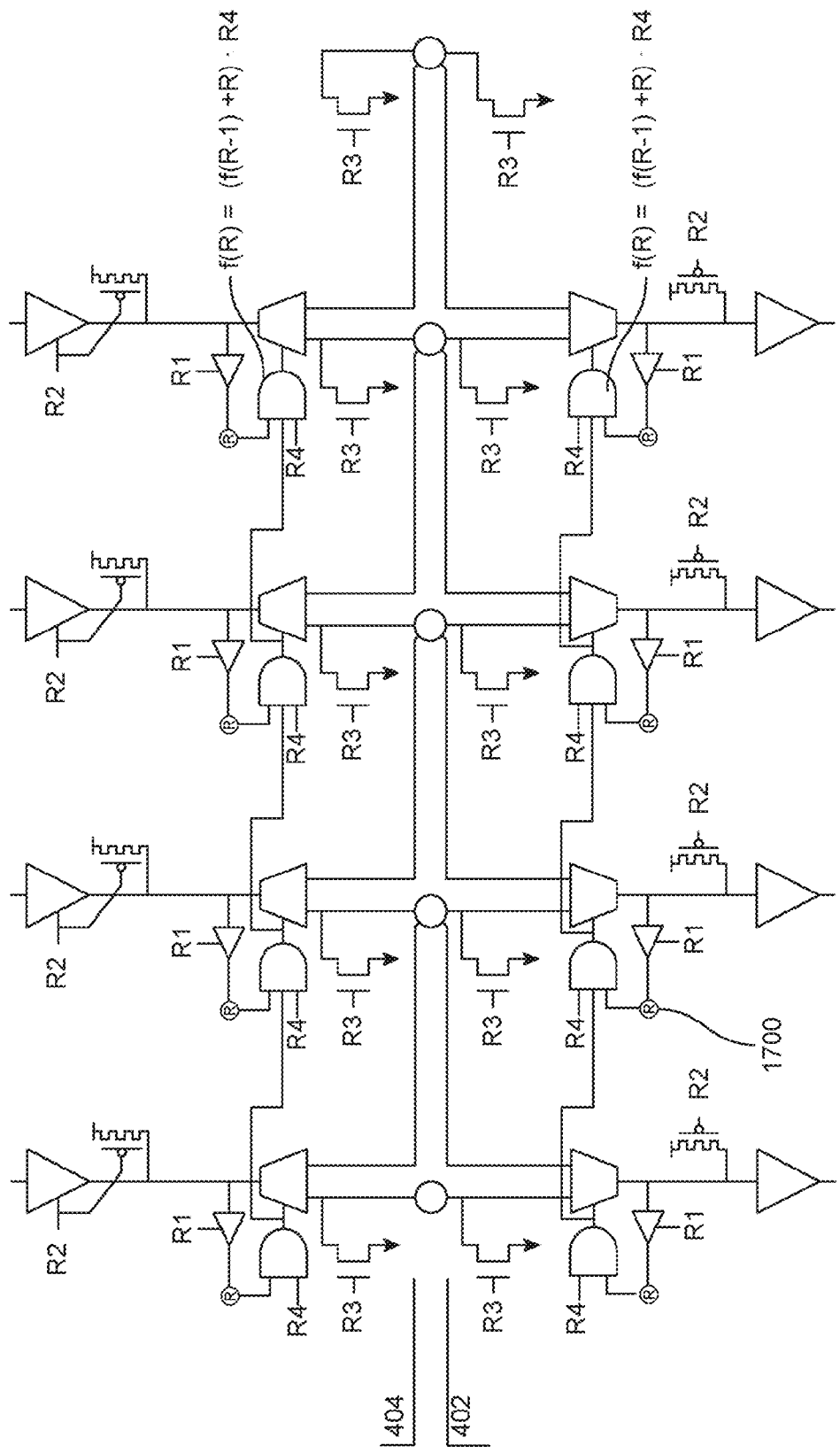
FIG. 17 illustrates an alternate implementation of a multi-die device with redundancy control with directional signals in accordance with some embodiments.

FIG. 17 illustrates an exemplary implementation of redundancy control with directional signals in some embodiments. In the exemplary implementation illustrated in FIG. 17, the test logic is added to the directional path(s). The exemplary implementation illustrated in FIG. 17 exhibits significant impact on delay in the upper self-annealing circuit block (circuit components above the μbumps), and little impact on delay in the lower self-annealing circuit block (circuit components below the μbumps). The exemplary implementation may be asynchronous in some embodiments. The exemplary implementation illustrated in FIG. 17 may also use test random access memory (TRAM), such as the three-state buffers with T1 select signal, to sample or drive output/input buffers. The TRAM comprises a random access memory cell or a location in the CRAM address map that is used to write to or read from a node of interest for testing purposes but not for FPGA configuration in some embodiments.

It can also be seen from the exemplary implementation illustrated in FIG. 17 that multiplexing is implemented at the output of buffers to drive μbumps. This may require the buffers to be large to keep the delay low. In some embodiments, configuration bits 1700 may have multiple programming sources which are denoted by three-state buffers because these configuration bits constitute latches. In these embodiments, the three-state buffers write to these latches in the same manner as a word line bit line write. In some embodiments, the configuration bit 1700 is addressable to be written using non-volatile data at power up.

Figure 18:
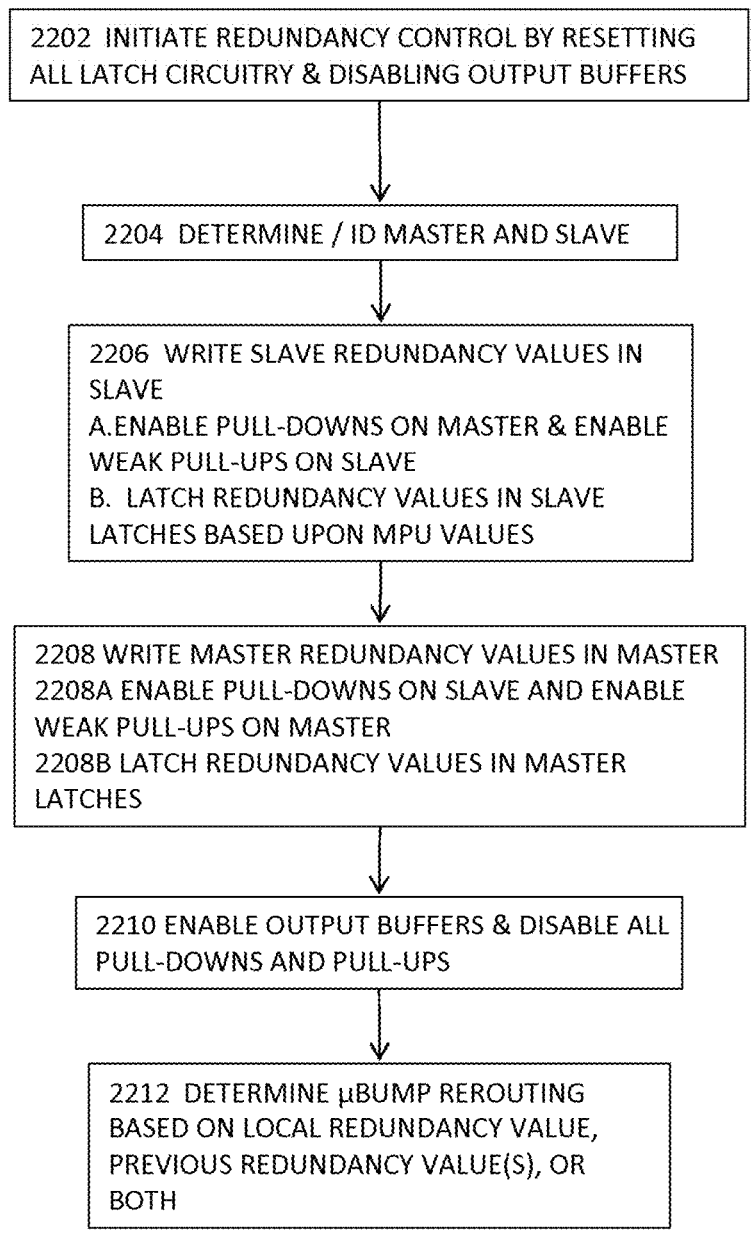
FIG. 18 illustrates a high level flow diagram for a process for self-annealing multi-die interconnect redundancy control in accordance with some embodiments.

FIG. 18 illustrates a high level flow diagram of a method for self-annealing multi-die interconnect redundancy control in some embodiments. In some embodiments, the method for self-annealing multi-die interconnect redundancy control comprises an action of initiating redundancy control by resetting one or more registers, and disabling one or more buffers at 2202. The method may further comprise the action of determining or identifying the master-slave relationship between the first redundancy control block for the first self-annealing circuit block and the second redundancy control block for the second self-annealing circuit block at 2204 in some embodiments. At 2206, the method may further comprise the action of writing, storing, or latching one or more redundancy values in the register(s) in the self-annealing circuit block that has been determined to be the slave in some embodiments. In one or more embodiments, the action of writing, storing, or latching one or more redundancy values in the register(s) at 2206 may comprise the action of enabling the pull-down transistor(s) in the master by driving a global control signal using the corresponding redundancy controller that has been determined to be a part of the master, and the action of enabling the weak pull-up transistor(s) in the slave by driving another global control signal using the corresponding redundancy controller that has been determined to be a part of the slave at 2206A, and the action of writing, storing, or latching the redundancy value(s) in the volatile memory in the slave at 2206B.

At 2208, the method may further comprise the action of writing one or more redundancy values in the register(s) of the self-annealing circuit block that has been determined to be the master in some embodiments. In one or more embodiments, the action of writing, storing, or latching one or more redundancy values in the register(s) at 2208 may further comprise the actions of enabling the pull-down transistor(s) in the slave by driving a global control signal using the corresponding redundancy controller that has been determined to be a part of the slave, and the action of enabling the weak pull-up transistor(s) in the master by driving another global control signal using the corresponding redundancy controller that has been determined to be a part of the master at 2208A, and the action of writing, storing, or latching the redundancy value(s) in the volatile memory in the master at 2208B. At 2210, output buffers on input(s) are enabled, and all pull-downs and pull-ups are disabled. At 2212, the method may further comprise the action of determining whether or not a data-path through a μbump is to be re-routed by using a value in a redundancy register, previous value(s) in the redundancy register(s), or both.

Figure 19:
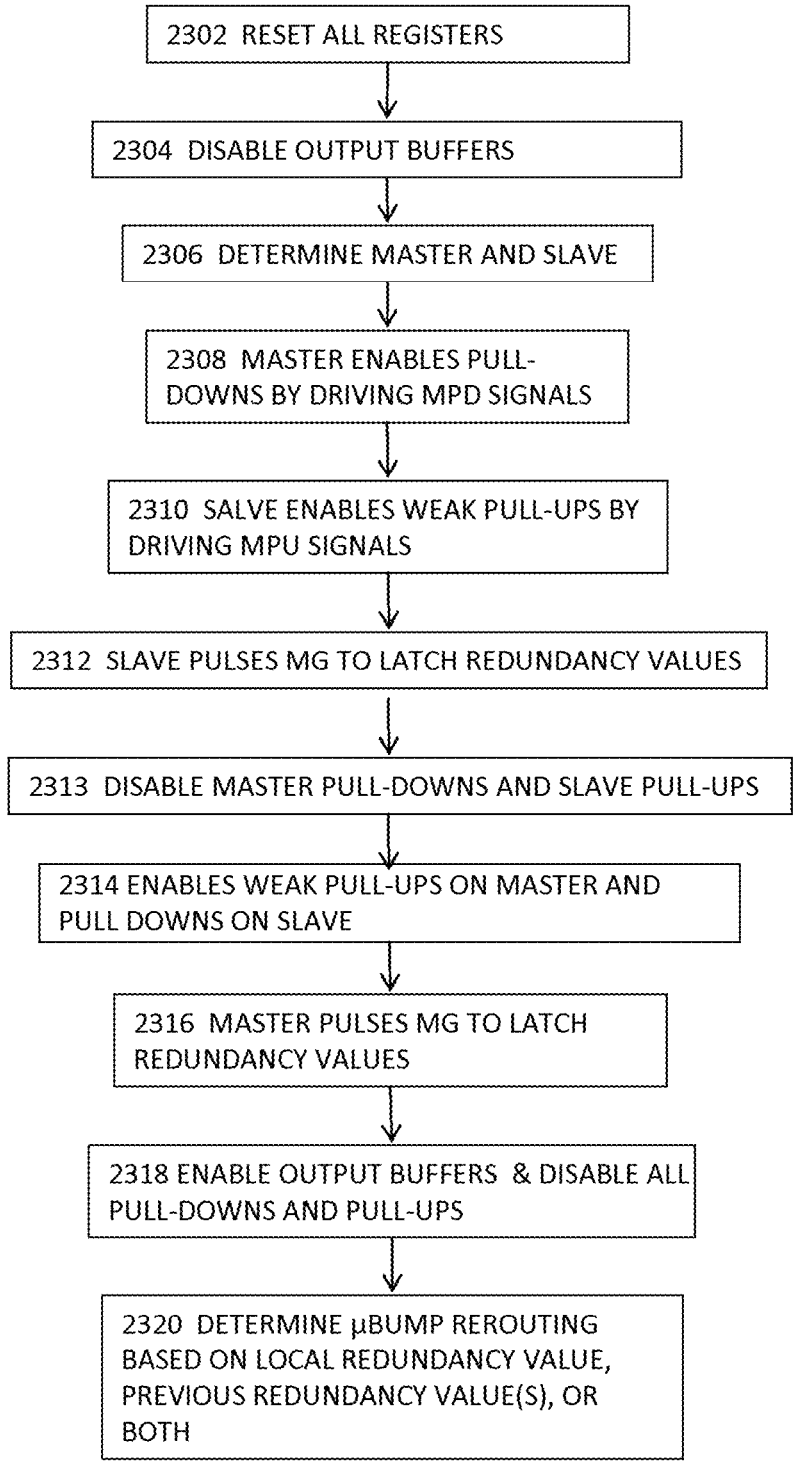
FIG. 19 illustrates more details for the high level flow diagram for a process for self-annealing multi-die interconnect redundancy control illustrated in FIG. 18 in accordance with some embodiments.

FIG. 19 illustrates more details for the high level flow diagram for a process for self-annealing multi-die interconnect redundancy control illustrated in FIG. 18 in some embodiments. The method for implementing self-annealing multi-die interconnect redundancy control comprises the action of resetting all registers in a carrier die that bridges the first die 402 and the second die of 404 the multi-die device at 2302, and the action of disabling output buffers of the carrier die at 2304 in some embodiments. At 2306, the method may further comprise the action of determining a master-slave relationship between a first redundancy control block for the first self-annealing circuit block of the carrier die and the second redundancy control for the second self-annealing circuit block in some embodiments.

At 2308, the method further comprises the action of enabling one or more pull-down transistors by using the master redundancy control block (e.g., the redundancy control block that has been determined to be the master in the master-slave relationship) to drive another global control signal to the slave self-annealing circuit block in some embodiments. At 2310, the method further comprises the action of enabling one or more weak pull-up transistors by using the slave redundancy control block to drive another global control signal to the slave self-annealing circuit block (e.g., the self-annealing circuit block associated with the slave redundancy control block) in some embodiments. In some embodiments, the redundancy value of "1" in a register indicates that cascading redundancy is enabled, whereas a redundancy value of "0" in a register indicating there is no cascading redundancy.

At 2312, the method may further comprise the action of pulsing a clock signal by using the slave redundancy control block to write, store, or latch the one or more redundancy values in the registers in some embodiments. At 2313, the system disables the master pull-downs, and disables the slave pull-ups. At 2314, the method may further comprise the action of enabling one or more weak pull-up transistors on master by using the master redundancy control block to drive another global control signal to the one or more weak pull-up transistors, and the action of enabling one or more pull-down transistors on slave by using the slave redundancy control block to drive a global control signal to the one or more pull-down transistors in some embodiments. In these embodiments, if a μbump functions as intended, an input of "0" is driven to the register to indicate that cascading redundancy is disabled; if the μbump associated with a register is faulty, an input of "1" is driven to the register to indicate that cascading redundancy is enabled.

At 2316, the master redundancy control block pulses the clock signal (MG) to write, store, or latch the one or more redundancy values in the respective registers based at least in part upon the condition of the μbumps that are associated with the respective registers in some embodiments. At 2318, all tests are complete, and the method may further comprise the action of enabling the output buffers, which have been disabled at 2304, and disabling app pull-down and pull-up transistors in the carrier die in some embodiments. At 2320, the method may then determine whether or not the functionality of μbumps are to be replaced by that of other μbumps (i.e., through μbumps rerouting) in some embodiments. In some embodiments, the method makes the determination using a value in a redundancy register, previous value(s) in the redundancy register(s), or both. Also, in some embodiments, the method makes the determination using a value in the redundancy register that drives the μbump and another value in an OR gate that is operatively connected to a neighboring redundancy registers to determine whether to enable redundancy to replace the functionality of the μbump with the functionality of another μbump such as a downstream μbump or a redundant μbump.

Figure 20:
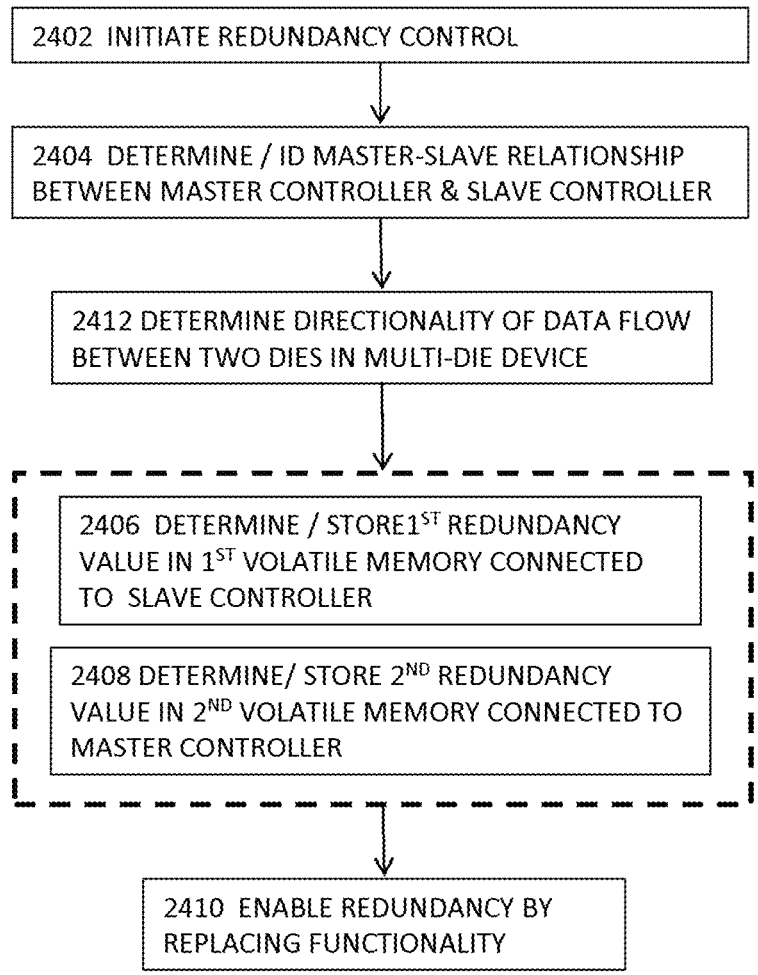
FIG. 20 illustrates a high level flow diagram for a process for self-annealing multi-die interconnect redundancy control in accordance with some embodiments.

FIG. 20 illustrates a high level flow diagram for a method for implementing self-annealing multi-die interconnect redundancy control in accordance with some embodiments. The method for implementing self-annealing multi-die interconnect redundancy control comprises the action of initiating redundancy control at 2402. In some embodiments, the action of initiating redundancy control at 2402 comprises the action of resetting all registers in a carrier die interconnecting the first die 402 and the second die 404 in a multi-die device and the action of disabling the output buffer(s) in the carrier die on the input side of the multi-die device.

In some embodiments, the method may further comprise the action of determining or identifying the master-slave relationship between a first redundancy control block for the first self-annealing circuit block in the carrier die, and a second redundancy control block for the second self-annealing circuit block in the carrier die at 2404. In some embodiments, the method may further comprise determining the directionality of data flow between the first die 402 and the second die 404 via the carrier die at 2412. In these embodiments, the method determines whether each of the first redundancy circuit block and the second redundancy circuit block acts as an input, an output, or as a combination of input and output.

The method may further comprise the action of determining and storing one or more first redundancy values in the first volatile register that is connected to the slave redundancy control block (e.g., the redundancy control block that has been determined to be the slave in the master-slave relationship) at 2406 in some embodiments. The method may also comprise the action of determining and storing one or more second redundancy values in the second volatile register that is connected to the master redundancy control block (e.g., the redundancy control block that has been determined to be the master in the master-slave relationship) at 2408 in some embodiments.

At 2410, the method may comprise the action of enabling redundancy based on the conditions of μbumps in the carrier die in some embodiments. In some embodiments, the method may determine to enable redundancy for a repair process for a particular slice in the carrier die if the μbump in this particular slice is determined to be faulty. In these embodiments, the method may further comprise the action of replacing the functionality of the faulty μbump with the functionality of another μbump downstream, and the action of sending the redundancy information downstream to enable cascading redundancy. It shall be noted that the term "downstream" is used here to indicate that a first component (e.g., a μbump or a register) is farther apart from its corresponding redundancy control block than a second component is to the same redundancy control block.

Figure 21:
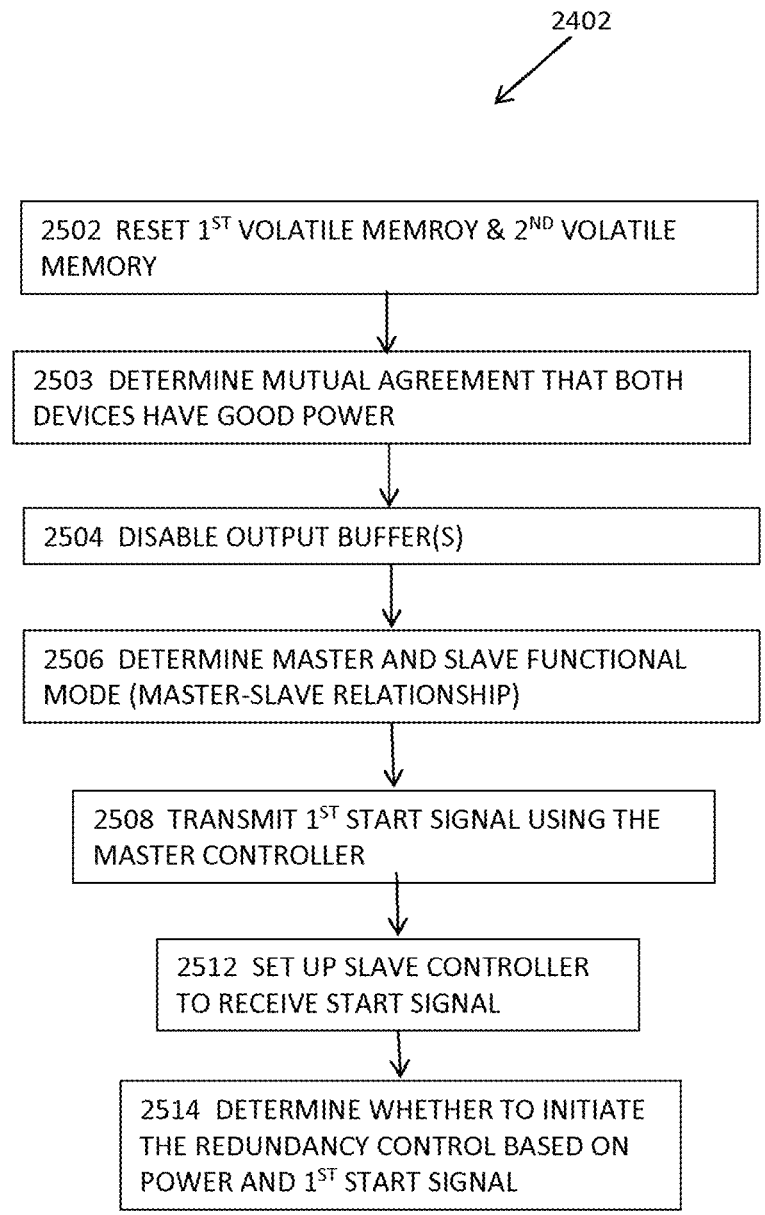
FIG. 21 illustrates more details for the process of initiating redundancy control in FIG. 20 in accordance with some embodiments.

FIG. 21 illustrates more details for the process of initiating redundancy control in FIG. 20 in accordance with some embodiments. The process comprises the action of resetting the first register in the first self-annealing circuit block and the second register in the second self-annealing circuit block at 2502, the action of determining mutual agreement that both devices have good power at 2503, and the action of disabling the output buffers of a multi-die device at 2504. The process may further comprise the action of determining master and slave functional mode at 2506, and the action of transmitting the first start signal using the master redundancy control block at 2508 in some embodiments. In these embodiments, the master redundancy control block transmits the start signal only when it is determined that the power to all dies are good. At 2512, the system sets up the slave controller to receive start signal. At 2514, the process may further comprise the action of determining whether to initiate the redundancy control based at least in part on power and the first start signal from the master redundancy control block.

Figure 22A:
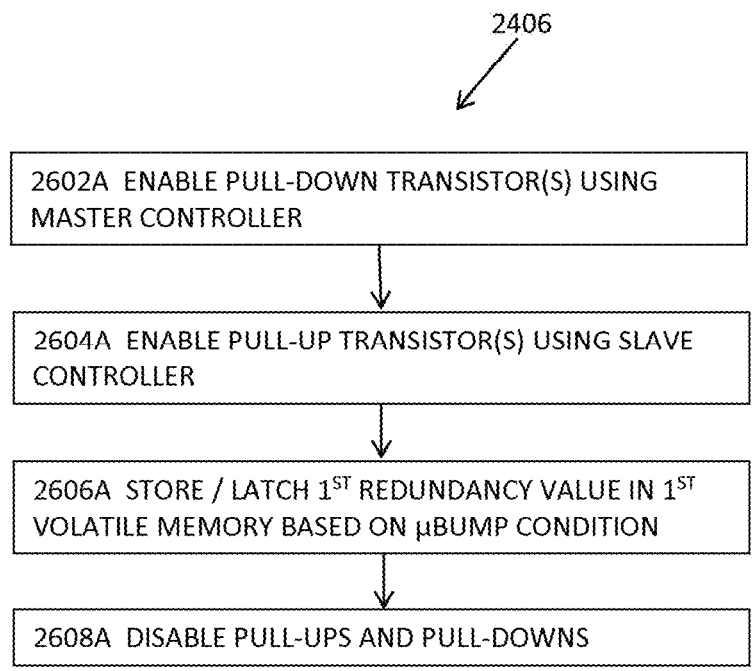
FIGS. 22A-B illustrate more details for the action of determining and storing one or more first redundancy values and the action of determining and storing one or more second redundancy values in FIG. 20 in accordance with some embodiments.
Figure 22B:
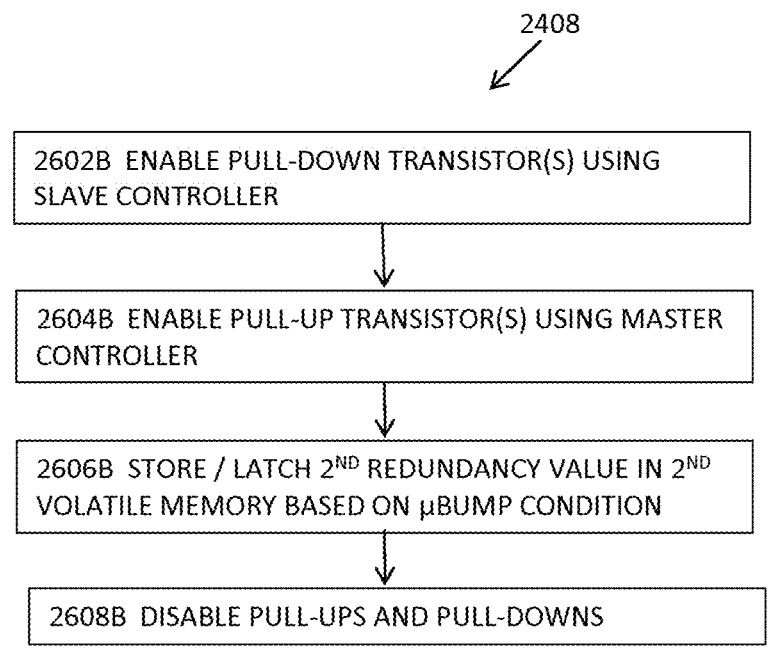

FIGS. 22A-22B illustrate more details for the action 2406 of determining and storing one or more first redundancy values and the action of determining and storing one or more second redundancy values in FIG. 20 in some embodiments. The action 2406 of determining and storing one or more first redundancy values in the first register comprises the action of enabling one or more pull-down transistors using the master redundancy control block at 2602A, and the action of enabling one or more weak pull-up transistors using the slave redundancy control block at 2604A in some embodiments. The action 2406 may further comprise the action of writing, storing, or latching the one or more first redundancy values in the first registers that are connected to and controlled by the slave redundancy control block based at least in part upon the condition(s) of the corresponding μbump for each of the first registers at 2606A in some embodiments. In some embodiments where there exists a faulty μbump, the method determines that the input to the corresponding register controlled by the slave redundancy control block is a "1" and latches the redundancy value in the register accordingly. In some embodiments where it is determined that the μbump is good, the method determines that the input to the corresponding register controlled by the slave redundancy control block is a "0" and latches the redundancy value in the register accordingly. The system then disables the pull-ups and pull-downs at 2608A.

In one or more embodiments, the action 2408 of determining and storing one or more second redundancy values in the second register 2408 comprises the action of enabling one or more pull-down transistors using the slave redundancy control block at 2602B, and the action of enabling one or more weak pull-up transistors using the master redundancy control block at 2604B in some embodiments. The action 2408 may further comprise the action of writing, storing, or latching the one or more second redundancy values in the second registers that are connected to and controlled by the master redundancy control block based at least in part upon the condition(s) of the corresponding μbump for each of the second registers at 2606B in some embodiments. In some embodiments where there exists a faulty μbump, the method determines that the input to the corresponding register controlled by the master redundancy control block is a "1", and latches the redundancy value in the register accordingly. In some embodiments where it is determined that the μbump is good, the method determines that the input to the corresponding register controlled by the master redundancy control block is a "0", and latches the redundancy value in the register accordingly. The system then disables the pull-ups and pull-downs at 2608B.

Although particular embodiments have been shown and described, it will be understood that they are not intended to limit the claimed invention, and it will be obvious to those skilled in the art that various changes and modifications may be made without departing from the spirit and scope of the present inventions. The specification and drawings are, accordingly, to be regarded in an illustrative rather than restrictive sense. The claimed invention are intended to cover alternatives, modifications, and equivalents.

What is claimed:

1. An apparatus for interconnecting a first die and a second die of a multi-die device, comprising:
   a master circuit block that interfaces with the first die of the multi-die device;
   a slave circuit block that interfaces with the second die of the multi-die device;
   a first memory in the slave circuit block;
   a second memory in the master circuit block; and
   a plurality of μbumps between the first die and the second die;
   wherein the master circuit block and the slave circuit block are configured to identify one of the μbumps as a faulty μbump, and
   wherein the slave circuit block is configured to generate a first value and store the first value in the first memory in the slave circuit block, and the master circuit block is configured to generate a second value and store the second value in the second memory in the master circuit block, wherein the first and second values correspond to the identified faulty μbump.

2. The apparatus of claim 1, wherein the master circuit block and the slave circuit block are configured to replace a functionality of the faulty μbump with a functionality of another one of the plurality of μbumps.

3. The apparatus of claim 2, wherein the master circuit block and the slave circuit block are configured to replace the functionality of the faulty μbump with the functionality of another one of the plurality of μbumps based at least in part on the first value stored in the first memory and the second value stored in the second memory.

4. The apparatus of claim 3, wherein the master circuit block and the slave circuit block are configured to determine a third value based on the first and the second values that are stored in the first and second memories, respectively.

5. The apparatus of claim 1, wherein at least one of the μbumps is a faulty μbump.

6. The apparatus of claim 1, wherein:
   the master circuit block is integrated with the first die; and
   the slave circuit block is integrated with the second die.

7. The apparatus of claim 1, wherein the first and second memories comprise volatile memories.

8. The apparatus of claim 1, wherein the first and second memories comprise non-volatile memories.

9. The apparatus of claim 1, further comprising a carrier die that includes μbumps and redundant μbumps interfacing with the first die and the second die, the first die and the second die being connected indirectly through the carrier die.

10. An apparatus for interconnecting a first die and a second die of a multi-die device, comprising:
    a master self-annealing circuit block that interfaces with the first die of the multi-die device and comprises a master controller;
    a slave self-annealing circuit block that interfaces with the second die of the multi-die device and comprises a slave controller;
    a first volatile memory in the slave self-annealing circuit block;
    a second volatile memory in the master self-annealing circuit block;
    a μbump and a redundant μbump;
    wherein the master self-annealing circuit block and the slave self-annealing circuit block are configured to interconnect the first die and the second die using one of the μbump or the redundant μbump; and
    wherein the master controller and the slave controller are configured for:
       determining whether there is another μbump situated between the redundant μbump and the μbump if the μbump is a faulty μbump; and
       replacing a functionality of the faulty μbump based at least in part upon a result of the act of determining.

11. The apparatus of claim 10, wherein the master controller and the slave controller are configured for replacing the functionality of the faulty μbump with a functionality of the redundant μbump when there is no μbump or at least one μbump between the faulty μbump and the redundant μbump.

12. The apparatus of claim 10, wherein the master controller and the slave controller are configured for:
    determining a first redundancy value and storing the first redundancy value in the first volatile memory in the slave self-annealing circuit block;
    determining a second redundancy value and storing the second redundancy value in the second volatile memory in the master self-annealing circuit block;
    determining one or more values from at least the first redundancy value and the second redundancy value; and
    selectively using one of the μbump and the redundant μbump to interconnect the first die and the second die based at least in part upon the one or more values that are determined from at least the first redundancy value and the second redundancy value.

13. The apparatus of claim 10, wherein the slave controller is configured to determine a first redundancy value for storing in the first volatile memory by:
    enabling a master pull-down transistor in the master self-annealing circuit block; and
    enabling a slave pull-up transistor in the slave self-annealing circuit block.

14. The apparatus of claim 10, wherein the slave controller operates at a slave clock frequency, the master controller operates at a master clock frequency, and the master clock frequency is different from the slave clock frequency.

15. The apparatus of claim 10, wherein the master controller and the slave controller are further configured to reset the first volatile memory and the second volatile memory, and to disable one or more output buffers of the multi-die device.

16. A method for interconnecting a first die and a second die of a multi-die device, comprising:
    determining a master-slave relationship between a master controller of a master self-annealing circuit block for the first die of the multi-die device and a slave controller of a slave self-annealing circuit block for the second die of the multi-die device;
    wherein the first die and the second die are coupled together through the master self-annealing circuit block, the slave self-annealing circuit block, and one of a first μbump or a second μbump;
    generating a first redundancy value at the slave self-annealing circuit block;
    storing the first redundancy value in a first volatile memory that is operatively connected to the slave controller, the first volatile memory being in the slave self-annealing circuit block;
    generating a second redundancy value at the master self-annealing circuit block; and storing the second redundancy value in a second volatile memory that is operatively connected to the master controller, the second volatile memory being in the master self-annealing circuit block, wherein the first and second redundancy values correspond to a µbump condition.

17. An apparatus for interconnecting a first die and a second die of a multi-die device, comprising:

a first controller that interfaces with the first die of the multi-die device;

a second controller that interfaces with the second die of the multi-die device and is interconnected with the first controller through a first µbump and a second µbump; and a plurality of circuit slices, wherein each of the plurality of circuit slices interfaces with both the first die and the second die of the multi-die device, and is controlled by both the first controller and the second controller;

wherein the first controller and the second controller are in a master-and-slave relationship in which one of the first controller and the second controller is a master, and another one of the first controller and the second controller is a slave, the master configured to initiate a self-annealing process based at least in part upon a master internal oscillator, and the slave configured to make state transitions based on a rate determined by a slave internal oscillator and the master;

wherein the first controller and the second controller are not synchronized; and wherein the first controller and the second controller are architecturally identical but are configured to behave differently based at least in part upon the master-slave relationship.

18. The apparatus of claim 17, wherein:

the first controller comprises a first master-slave select pin, and is configured to sample first inputs at the first master-slave select pin based at least in part upon a first power associated with the first die, the second controller comprises a second master-slave select pin, and is configured to sample second inputs at the second master-slave select pin based at least in part upon a second power associated with the second die, the master-slave relationship is based at least in part upon the first inputs and the second inputs that are sampled, and the master is configured to drive a first signal to initiate the self-annealing process, and the slave is configured to use the first signal from the master as an input signal.

* * * * *